(12) United States Patent
Araki et al.

(10) Patent No.: US 9,023,764 B2
(45) Date of Patent: May 5, 2015

(54) OXIDE SUPERCONDUCTOR, ORIENTED OXIDE THIN FILM, AND METHOD FOR MANUFACTURING OXIDE SUPERCONDUCTOR

(71) Applicant: Kabushiki Kaisha Toshiba, Tokyo (JP)

(72) Inventors: Takeshi Araki, Tokyo (JP); Mariko Hayashi, Chiba-ken (JP); Ko Yamada, Kanagawa-ken (JP); Hiroyuki Fuke, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 13/766,994

(22) Filed: Feb. 14, 2013

(65) Prior Publication Data

US 2014/0031236 A1 Jan. 30, 2014

(30) Foreign Application Priority Data

Mar. 23, 2012 (JP) ................................. 2012-068377

(51) Int. Cl.
*H01B 12/06* (2006.01)
*H01L 39/24* (2006.01)
(Continued)

(52) U.S. Cl.
CPC .......... *H01L 39/128* (2013.01); *C04B 35/4508* (2013.01); *H01L 39/126* (2013.01);
(Continued)

(58) Field of Classification Search
CPC ... H01L 39/126; H01L 39/128; H01L 39/143; H01L 39/24; H01L 39/248; H01L 39/2425; H01L 39/2454; H01L 39/2458; H01L 39/2461; H01B 12/02; H01B 12/06; C04B 35/45; C04B 35/4504; C04B 35/4508; C04B 35/016; B05D 5/12; B32B 15/04
USPC ......... 505/100, 150, 230, 237, 238, 239, 434, 505/470, 704; 428/457, 469, 472, 698, 701, 428/702; 427/62, 126.3, 376.4; 174/125.1
See application file for complete search history.

(56) References Cited

U.S. PATENT DOCUMENTS 5,834,794 A * 11/1998 Fuke et al. ........................ 257/39
5,974,336 A * 10/1999 Yamada et al. ............... 505/230
(Continued)

FOREIGN PATENT DOCUMENTS

JP 2996568 B2 1/2000
JP 2000-106455 A 4/2000
(Continued)

OTHER PUBLICATIONS

Office Action issued Jul. 24, 2014, in Japanese Patent Application No. 2012-068377 with English translation.
(Continued)

*Primary Examiner* — Stanley Silverman
*Assistant Examiner* — Kallambella Vijayakumar
(74) *Attorney, Agent, or Firm* — Oblon, McClelland, Maier & Neustadt, L.L.P.

(57) ABSTRACT

According to one embodiment, an oxide superconductor includes an oriented superconductor layer and an oxide layer. The oriented superconductor layer contains fluorine at $2.0 \times 10^{16}$-$5.0 \times 10^{19}$ atoms/cc and carbon at $1.0 \times 10^{18}$-$5.0 \times 10^{20}$ atoms/cc. The superconductor layer contains in 90% or more a portion oriented along c-axis with an in-plane orientation degree ($\Delta\phi$) of 10 degrees or less, and contains a $LnBa_2Cu_3O_{7-x}$ superconductor material (Ln being yttrium or a lanthanoid except cerium, praseodymium, promethium, and lutetium). The oxide layer is provided in contact with a lower surface of the superconductor layer and oriented with an in-plane orientation degree ($\Delta\phi$) of 10 degrees or less with respect to one crystal axis of the superconductor layer. Area of a portion of the lower surface of the superconductor layer in contact with the oxide layer is 0.3 or less of area of a region directly below the superconductor layer.

20 Claims, 10 Drawing Sheets

(51) Int. Cl.
  *B05D 5/12* (2006.01)
  *B32B 18/00* (2006.01)
  *C04B 35/45* (2006.01)
  *H01L 39/12* (2006.01)
  *C04B 35/624* (2006.01)

(52) U.S. Cl.
  CPC ........ *H01L39/2425* (2013.01); *H01L 39/2461* (2013.01); *C04B 2235/3215* (2013.01); *C04B 2235/3225* (2013.01); *C04B 2235/3281* (2013.01); *C04B 35/624* (2013.01); *C04B 2235/3224* (2013.01); *C04B 2235/449* (2013.01); *C04B 2235/522* (2013.01); *C04B 2235/5268* (2013.01); *C04B 2235/5296* (2013.01); *C04B 2235/6585* (2013.01); *C04B 2235/6588* (2013.01); *C04B 2235/663* (2013.01); *C04B 2235/721* (2013.01); *C04B 2235/724* (2013.01); *C04B 2235/787* (2013.01); *Y10S 505/704* (2013.01)

(56) References Cited

U.S. PATENT DOCUMENTS

| | | | |
|---|---|---|---|
| 6,756,139 B2 * | 6/2004 | Jia et al. | 428/701 |
| 7,071,149 B2 * | 7/2006 | Selvamanickam | 505/237 |
| 2002/0086799 A1 * | 7/2002 | Araki et al. | 505/100 |
| 2004/0192559 A1 * | 9/2004 | Araki et al. | 505/100 |
| 2006/0058195 A1 * | 3/2006 | Araki et al. | 505/100 |
| 2006/0115964 A1 * | 6/2006 | Findikoglu et al. | 438/509 |
| 2007/0238619 A1 * | 10/2007 | Xiong | 505/100 |

FOREIGN PATENT DOCUMENTS

| | | |
|---|---|---|
| JP | 3415888 B2 | 6/2003 |
| JP | 3556586 B2 | 8/2004 |
| JP | 2008-243895 A | 10/2008 |

OTHER PUBLICATIONS

A. Goyal, et al., "High critical current density superconducting tapes by epitaxial deposition of $YBa_2Cu_3O_x$ thick films on biaxially textured metals", App. Phys. Lett., 69, (12), Sep. 16, 1996, pp. 1795-1797.

Takeshi Araki, et al., "Review of a chemical approach to $YBa_2Cu_3O_{7-x}$-coated superconductors-metalorganic deposition using trifluoroacetates", Institute of Physics Publishing Superconductor Science and Technology, 16, 2003, pp. R71-R94.

Yasuhiro Iijima, et al., "Ion Beam Assisted Growth of Fluorite Type Oxide Template Films for Biaxially Textured HTSC Coated Conductors" IEEE Transactions on Applied Superconductivity., vol. II. No. I. Mar. 2001, pp. 3457-3460.

Y. Y. Xie, et al., "Progress in scale-up of second-generation high-temperature superconductors at SuperPower Inc", Physica C. 426-431, 2005, pp. 849-857.

S. I. Kim, et al., "Mechanisms of weak thickness dependence of the critical current density in strong-pinning ex situ metal organic-deposition-route $YBa_2Cu_3O_{7-x}$ coated conductors", Institute of Physics Publishing Superconductor Science and Technology, 19, 2006, 968-979.

D. T. Verebelyi, et al., Low angle grain boundary transport in $YBa_2Cu_3O_{7-\sigma}$ coated conductors, Applied Physics Letters, vol. 76, No. 13, Mar. 27, 2000, pp. 1755-1757.

Extended European Search Report issued Oct. 6, 2014 in Patent Application No. 13156544.2.

D.X. Huang, et al., "Mechanism of NdBCO film growth on YBCO-seeded MgO substrate using liquid phase epitaxy" Physica C, vol. 378-381, XP 04383034, Oct. 1, 2002, pp. 980-983.

* cited by examiner

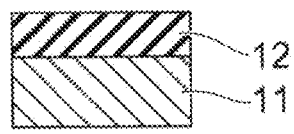
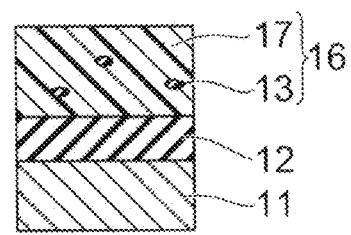
FIG. 2A         FIG. 2B         FIG. 2C
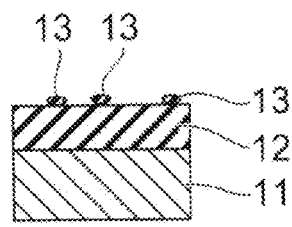
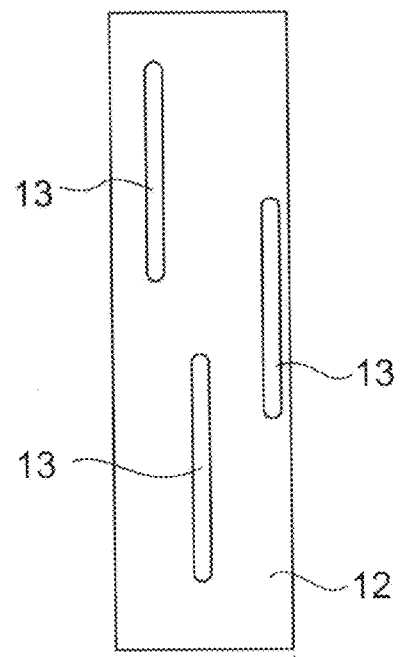
FIG. 2D
FIG. 2E

OXIDE SUPERCONDUCTOR, ORIENTED OXIDE THIN FILM, AND METHOD FOR MANUFACTURING OXIDE SUPERCONDUCTOR

CROSS-REFERENCE TO RELATED APPLICATIONS

This application is based upon and claims the benefit of priority from the prior Japanese Patent Application No. 2012-068377, filed on Mar. 23, 2012; the entire contents of which are incorporated herein by reference.

FIELD

Embodiments described herein relate generally to an oxide superconductor, an oriented oxide thin film, and a method for manufacturing oxide superconductor.

BACKGROUND

The technology of forming an oriented oxide thin film on a metal tape is the most advanced technology in the field of the second generation superconductors. In thin film formation technologies related to semiconductors and hard disks, in general, the film formation temperature is mostly as low as 400° C. or less. Thus, for instance, in film formation based on sputtering, particles impinging on the base material are not given energy enough to bind to other particles at the atomic level. Hence, in semiconductor and other technical fields, there are few cases discussed in terms of the in-plane orientation degree indicating the orientation texture.

On the other hand, in the film formation technology for yttrium-based (including lanthanoids) oxide superconductor formed at approximately 800° C., the formed oxide layer needs to be oriented at the atomic level. Thus, the film formation temperature is as high as 600-800° C., and the in-plane orientation degree is discussed in this technical field. It is the technical field of oxide superconductor that requires the highest orientation in the current thin film technology.

BRIEF DESCRIPTION OF THE DRAWINGS

FIGS. 2A to 2D are process sectional views illustrating a method for manufacturing the oxide superconductor according to the first embodiment, and FIG. 2E is a process plan view of the method for manufacturing the oxide superconductor according to the first embodiment;

DETAILED DESCRIPTION

In general, according to one embodiment, an oxide superconductor includes: an oriented superconductor layer containing fluorine at $2.0 \times 10^{16}$-$5.0 \times 10^{19}$ atoms/cc and carbon at $1.0 \times 10^{18}$-$5.0 \times 10^{20}$ atoms/cc, containing in 90% or more a portion oriented along c-axis with an in-plane orientation degree ($\Delta\phi$) of 10 degrees or less, and containing a $LnBa_2Cu_3O_{7-x}$ superconductor material (Ln being yttrium (Y) or a lanthanoid except cerium (Ce), praseodymium (Pr), promethium (Pm), and lutetium (Lu)); and an oxide layer provided in contact with a lower surface of the oriented superconductor layer and oriented with an in-plane orientation degree ($\Delta\phi$) of 10 degrees or less with respect to one crystal axis of the oriented superconductor layer. Area of a portion of the lower surface of the oriented superconductor layer in contact with the oxide layer is 0.3 or less of area of a region directly below the oriented superconductor layer.

In general, according to another embodiment, an oriented oxide thin film includes: a first oxide layer containing fluorine at $2.0 \times 10^{16}$-$5.0 \times 10^{19}$ atoms/cc and carbon at $1.0 \times 10^{18}$-$5.0 \times 10^{20}$ atoms/cc and containing in 90% or more a portion oriented with an in-plane orientation degree ($\Delta\phi$) of 10 degrees or less; and a second oxide layer provided in contact with a lower surface of the first oxide layer and oriented with an in-plane orientation degree ($\Delta\phi$) of 10 degrees or less with respect to one crystal axis of the first oxide layer, area of a portion of the lower surface of the first oxide layer in contact with the second oxide layer being 0.3 or less of area of a region directly below the first oxide layer.

In general, according to another embodiment, a method for manufacturing an oxide superconductor, includes: forming a gel film by forming an oriented portion in a foundation and exposing the oriented portion and a portion other than the oriented portion to a solution containing metal trifluoroacetate, the gel film being formed on the foundation and containing metal and fluoride contained in the metal trifluoroacetate; and forming an oriented superconductor layer by heat treating the foundation, the oriented superconductor layer having one crystal axis oriented with the oriented portion on the oriented portion and on the portion other than the oriented portion.

Embodiments of the invention will now be described with reference to the drawings.

First Embodiment

First, a first embodiment is described.

Figure 1A:
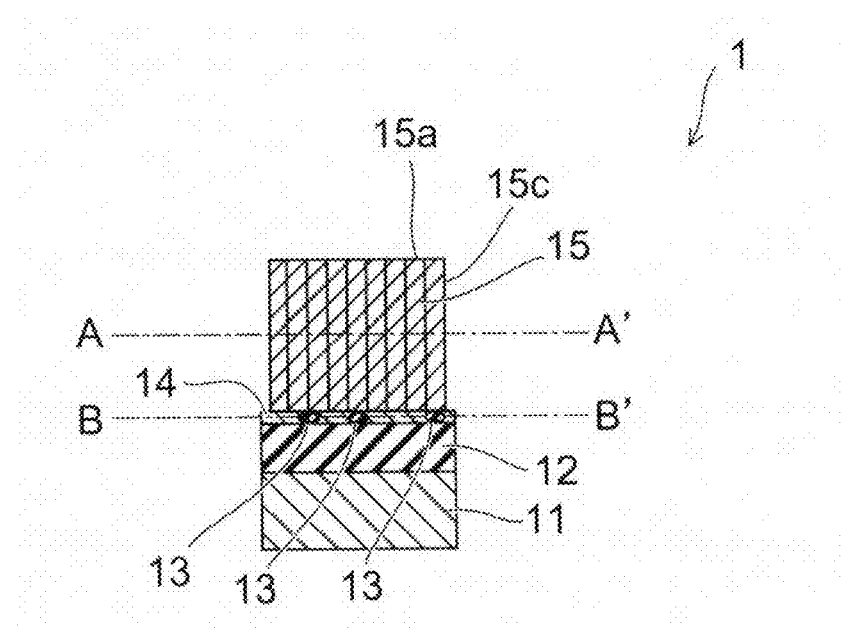
FIG. 1A is a sectional view illustrating an oxide superconductor according to a first embodiment.
Figure 1B:
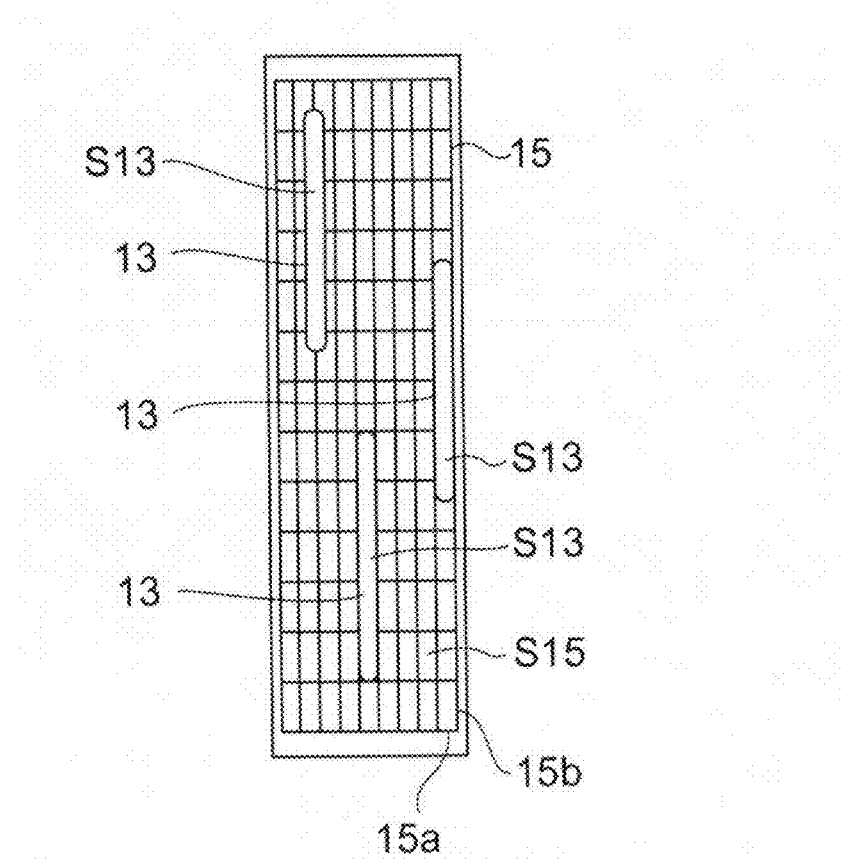
FIG. 1B is a schematic view of the oxide superconductor according to the first embodiment in which cross sections taken along line A-A' and line B-B' shown in FIG. 1A are combined.

FIG. 1A is a sectional view illustrating an oxide superconductor according to the first embodiment. FIG. 1B is a schematic view of the oxide superconductor according to the first embodiment in which cross sections taken along line A-A' and line B-B' shown in FIG. 1A are combined.

As shown in FIGS. 1A and 1B, the oxide superconductor 1 according to this embodiment includes a base material 11, a diffusion preventing layer 12, a plurality of orientation seeds (oxide layer, second oxide layer) 13 (an oxide lattice-matched with the overlying oxide 15 and having a large aspect ratio), an unoriented layer 14, and an oriented superconductor layer (first oxide layer) 15.

The base material 11 is e.g. a tape containing stainless steel (SUS). The upper surface of the base material 11 is e.g. smooth.

The diffusion preventing layer 12 is placed on the base material 11. The diffusion preventing layer 12 is e.g. an oxide layer of a prescribed material. For instance, the diffusion preventing layer 12 is intended to prevent nickel (Ni) contained in stainless steel from diffusing into the oriented superconductor layer 15 formed on the base material 11.

The plurality of orientation seeds 13 are placed on the diffusion preventing layer 12. The orientation seed 13 is e.g. an oxide-containing ceramic fiber. The shape of the orientation seed 13 extends in one direction. The length of the orientation seed 13 in the extending direction is e.g. 10-200 micrometers (μm). A longer length is more preferable. However, a length of 0.1 micrometers is also possible as long as the orientation seeds 13 can be oriented in the sheet. The cross section of the orientation seed 13 orthogonal to the extending direction has a width of 10-100 nanometers (nm) and a thickness of 1-10 nanometers (nm). The aspect ratio of width to thickness is often in the range from 1:5 to 1:30. The orientation seeds 13 are distributed on the upper surface of the diffusion preventing layer 12 with the extending direction being oriented. The in-plane orientation degree ($\Delta\phi$) of the long axis of each orientation seed 13 is 10 degrees or less, and preferably 2 degrees or less. $\Delta\phi$ indicates the statistical in-plane distribution of the orientation angle. This is an index commonly used in the field of superconductor. The value of $\Delta\phi$ can be measured by pole figure measurement.

The unoriented layer 14 is formed so as to be embedded between the orientation seeds 13 on the diffusion preventing layer 12. The upper surface of the unoriented layer 14 is preferably located at the same height as the upper surface of the orientation seeds 13. Alternatively, the upper surface of the unoriented layer 14 may be located below the upper surface of the orientation seeds 13. The propagation of the oriented layer is possible even if the upper surface of the unoriented layer 14 is located at a higher position than the upper surface of the orientation seeds 13.

The oriented superconductor layer 15 is placed on the orientation seeds 13 and on the unoriented layer 14. The orientation seeds 13 and the unoriented layer 14 are provided in contact with the lower surface of the oriented superconductor layer 15. The oriented superconductor layer 15 includes a monocrystalline portion. The monocrystalline portion includes crystal axes of e.g. the a-axis 15$a$, b-axis 15$b$, and c-axis 15$c$. In the monocrystalline portion, the crystal axes are oriented. With regard to the orientation direction of the crystal axes in the monocrystalline portion of the oriented superconductor layer 15, $\Delta\phi$ is 10 degrees or less, and more preferably 2 degrees or less.

For instance, the a-axis 15$a$ and the b-axis 15$b$ may be directed in two orthogonal directions in the plane parallel to the upper surface of the orientation seeds 13. Alternatively, the a-axis 15$a$ and the b-axis 15$b$ may form 45 degrees in the plane in the case where the orientation seed measures the lattice length of the superconductor multiplied by approximately the square root of 2 as in $CeO_2$. Here, the orthogonal case is described. The a-axis 15$a$ is directed in e.g. the longitudinal direction of the orientation seed 13. Thus, the orientation seeds 13 are oriented with a swing angle of 10 degrees or less with respect to the a-axis of the oriented superconductor layer 15. The b-axis 15$b$ is directed in the direction orthogonal to the extending direction of the longitudinal axis of the orientation seed 13. However, in the superconductor, the a-axis and the b-axis are nearly equal in length, and thus are frequently interchanged. The c-axis 15$c$ is directed in the direction orthogonal to the upper surface of the orientation seed 13. The portion of 90% or more of the oriented superconductor layer 15 includes crystals oriented along the c-axis. The orientation seed 13 functions as an orientation seed for orienting the oriented superconductor layer 15 formed on the orientation seed 13. On the other hand, the unoriented layer 14 is made of a metal having small polarity, or primarily an oxide layer having no lattice matching with the oriented superconductor layer 15. In the case of oxide having no lattice matching, the oxide may be oriented. This is because it is known to have no influence on the oriented layer thereon. The term "having no lattice matching" often refers to the condition that the lattice constant is 5% or less, or that the lattice constant under in-plane rotation of 45 degrees is 3% or less.

The oriented superconductor layer 15 contains e.g. $DyBa_2Cu_3O_{7-x}$ superconductor material. The unoriented layer 14 may also contain the same material as the oriented superconductor layer 15, such as $DyBa_2Cu_3O_{7-x}$ superconductor material. However, the monocrystalline portion of the unoriented layer 14 is less than the monocrystalline portion of the oriented superconductor layer 15. The proportion of oriented crystals in the unoriented layer 14 is smaller than the proportion of the oriented superconductor layer 15. Thus, $\Delta\phi$ of the unoriented layer 14 made of oxide is larger than $\Delta\phi$ of the oriented superconductor layer 15. Here, a metal such as Pt is electrically isotropic, and thus the measured value of $\Delta\phi$ is small. However, the oriented superconductor layer 15 does not form an oriented layer directly thereon. This is because the metal has small polarity, and thus the overlying oxide having large polarity does not assume a structure inheriting $\Delta\phi$.

The oriented superconductor layer 15 contains fluorine at $2.0\times10^{16}$-$5.0\times10^{19}$ atoms/cc and carbon at $1.0\times10^{18}$-$5.0\times10^{20}$ atoms/cc. This is an inevitable residue due to liquid phase sintering at chemical equilibrium, resulting from the TFA-MOD method.

The area of the region directly below the portion of the oriented superconductor layer 15 with $\Delta\phi$ being 10 degrees or less is denoted by SS. The total area of the areas S13 of the portions of the lower surface of the oriented superconductor layer 15 in contact with the orientation seeds 13 oriented with a swing angle of 10 degrees or less is denoted by SO. The relationship between the area SS and the area SO is area SO<0.3×area SS, i.e., the area SO is 0.3 times or less the area SS. Preferably, the area SO is 0.1 times or less the area SS. In this description, for instance, the area SS and the area SO may be also expressed as area $S_S$ and area $S_O$. The short side of the portion other than directly above the portion of the oriented superconductor layer 15 in contact with the orientation seeds 13 may be either approximately 10 nanometers, or 1 micrometer or more. Functioning as orientation seeds only requires several unit cells. Thus, directly above the portion in contact with the unoriented layer 14, the width of the oriented superconductor layer 15 in the direction parallel to the upper surface of the unoriented layer 14 is 30 nanometers (nm) or more, and preferably 5 micrometers (μm) or more. The oxide superconductor 1 containing the oriented oxide is also a thin film of the oriented oxide.

Next, a method for manufacturing the oxide superconductor 1 according to this embodiment is described.

FIGS. 2A to 2D are process sectional views illustrating the method for manufacturing an oxide superconductor according to the first embodiment. FIG. 2E is a process plan view of the method for manufacturing an oxide superconductor according to the first embodiment. FIG. 2E is a plan view of FIG. 2D.

First, as shown in FIG. 2A, a base material 11 is prepared. The base material 11 is e.g. a tape containing stainless steel (SUS).

Next, as shown in FIG. 2B, on the base material 11, a diffusion preventing layer 12 is formed. The diffusion preventing layer 12 is e.g. a prescribed oxide layer.

Next, as shown in FIG. 2C, on the diffusion preventing layer 12, an orientation seed sheet 16 is placed. The orientation seed sheet 16 includes e.g. a binder 17 containing an organic component and a plurality of orientation seeds 13. The orientation seeds 13 are oriented and distributed in the binder 17. To form the orientation seed sheet 16, for instance, the orientation seeds 13 are dispersed in a solution with a dispersant and formed into a narrow wire in the binder 17. Thus, the orientation distribution of the orientation seeds 13 can be set to Δφ being 10 degrees or less, and more preferably 2 degrees or less.

Next, as shown in FIGS. 2D and 2E, the orientation seed sheet 16 is heated at high temperature to remove the binder 17 by combustion. Thus, the orientation seeds 13 are left on the diffusion preventing layer 12 while being oriented with Δφ smaller than 2 degrees. Accordingly, the orientation seeds 13 are placed on the diffusion preventing layer 12. The combination of the base material 11, the diffusion preventing layer 12, and the orientation seeds 13 is referred to as foundation. The foundation includes an oriented portion, i.e., the orientation seeds 13, and an unoriented portion.

Next, by the TFA-MOD (trifluoroacetate metal organic deposition) method using metal trifluoroacetates described below, an oriented superconductor layer is formed on the diffusion preventing layer 12 and the orientation seeds 13 with small Δφ. First, a coating solution to be used in the TFA-MOD method is prepared.

Figure 3:
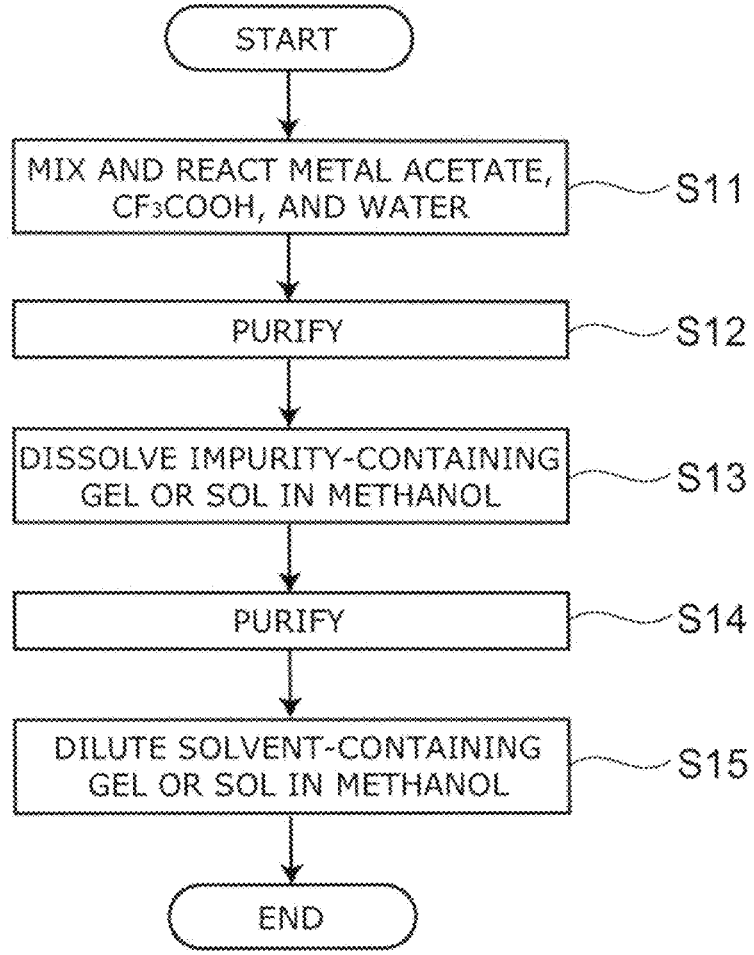
FIG. 3 is a flow chart illustrating a method for forming a coating solution in the method for manufacturing the oxide superconductor film according to the first embodiment.

FIG. 3 is a flow chart illustrating a method for forming a coating solution in the method for manufacturing an oxide superconductor film according to the first embodiment.

As shown in step S11 of FIG. 3, powder of hydrates of metal acetates, e.g., $Dy(OCOCH_3)_3$, $Ba(OCOCH_3)_2$, and $Cu(OCOCH_3)_2$, is each dissolved in ion-exchanged water. Each solution is mixed and stirred with a reaction equimolar amount of trifluoroacetate ($CF_3COOH$) to cause reaction. Thus, a mixed solution with a metal ion mole ratio of 1:2:3 is formed.

Next, as shown in step S12 of FIG. 3, the obtained mixed solution is poured into a recovery flask and subjected to reaction and purification for 12 hours under reduced pressure in a rotary evaporator. Thus, a translucent blue gel or sol is formed.

Next, as shown in step S13 of FIG. 3, part of the gel or sol is dissolved in methanol to form a coating solution of 1.52 M in terms of metal ions. This is a coating solution not highly purified, but mixed with impurity.

Next, as shown in step S14 of FIG. 3, the obtained gel or sol is completely dissolved in methanol equivalent to approximately 100 times by weight. Again, the solution is subjected to reaction and purification for 12 hours under reduced pressure in a rotary evaporator. Thus, a translucent blue gel or sol is formed.

Next, as shown in step S15 of FIG. 3, the obtained gel or sol is dissolved in methanol and diluted using a measuring flask. Thus, a coating solution of 1.52 M in terms of metal ions is formed.

Figure 4:
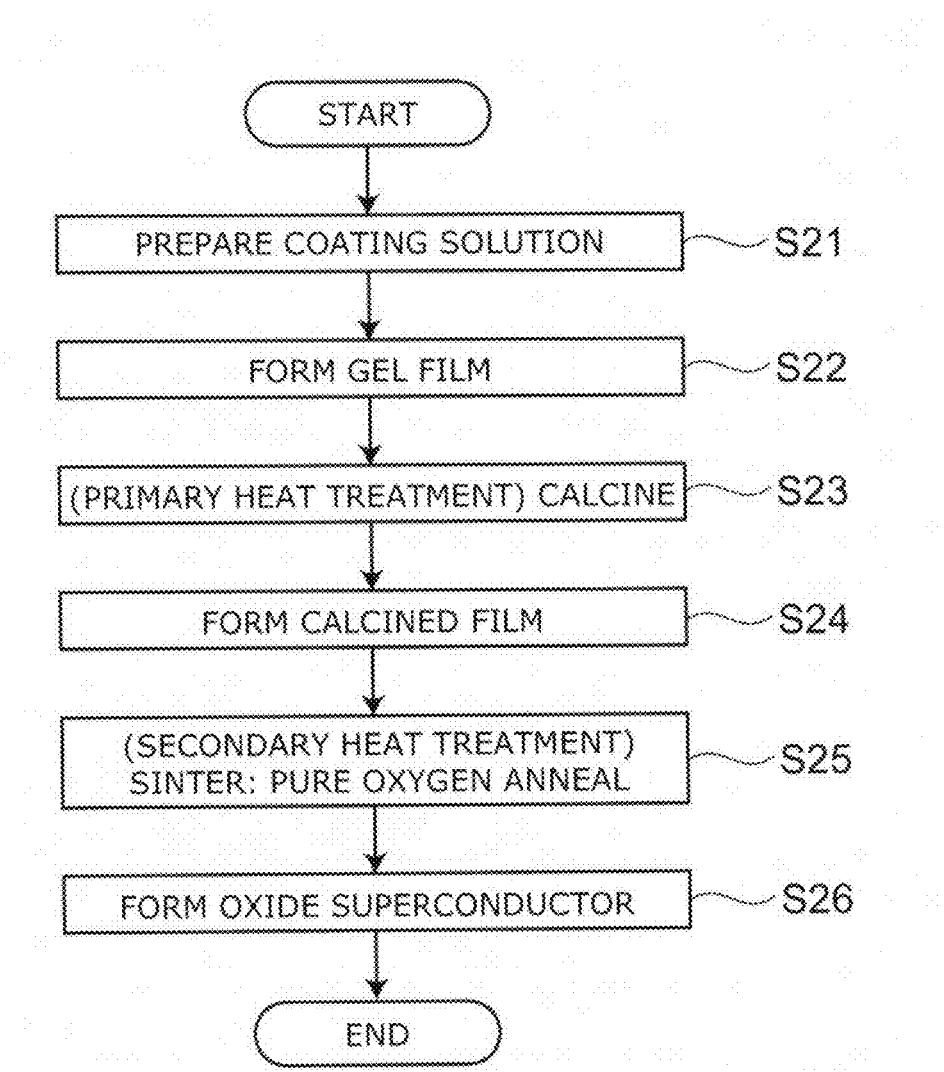
FIG. 4 is a flow chart illustrating the TFA-MOD method in the method for manufacturing the oxide superconductor according to the first embodiment.

FIG. 4 is a flow chart illustrating the TFA-MOD method in the method for manufacturing an oxide superconductor according to the first embodiment.

Figure 5:
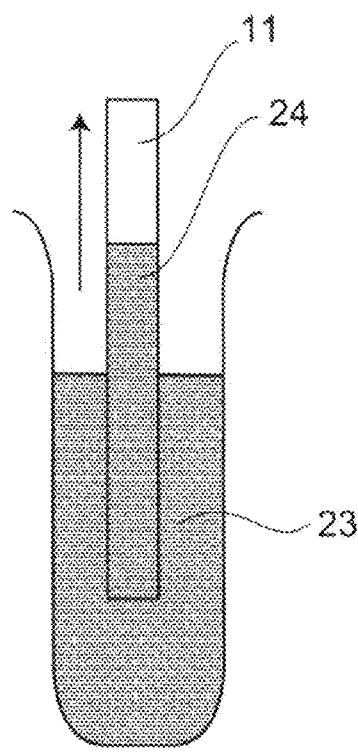
FIG. 5 is a schematic view illustrating the method for manufacturing the oxide superconductor according to the first embodiment.

FIG. 5 is a schematic view illustrating the method for manufacturing an oxide superconductor according to the first embodiment.

Figure 6:
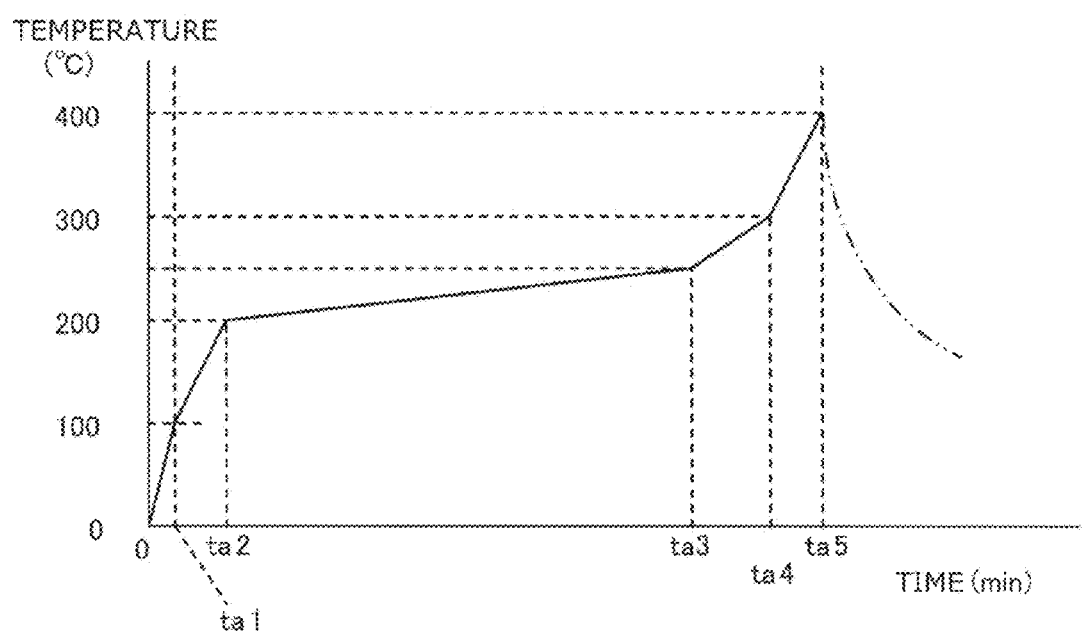
FIG. 6 is a graph illustrating the temperature profile during calcination in the method for manufacturing the oxide superconductor according to the first embodiment, where the vertical axis represents temperature, and the horizontal axis represents time.

FIG. 6 is a graph illustrating the temperature profile during calcination in the method for manufacturing an oxide superconductor according to the first embodiment. The vertical axis represents temperature, and the horizontal axis represents time.

Figure 7:
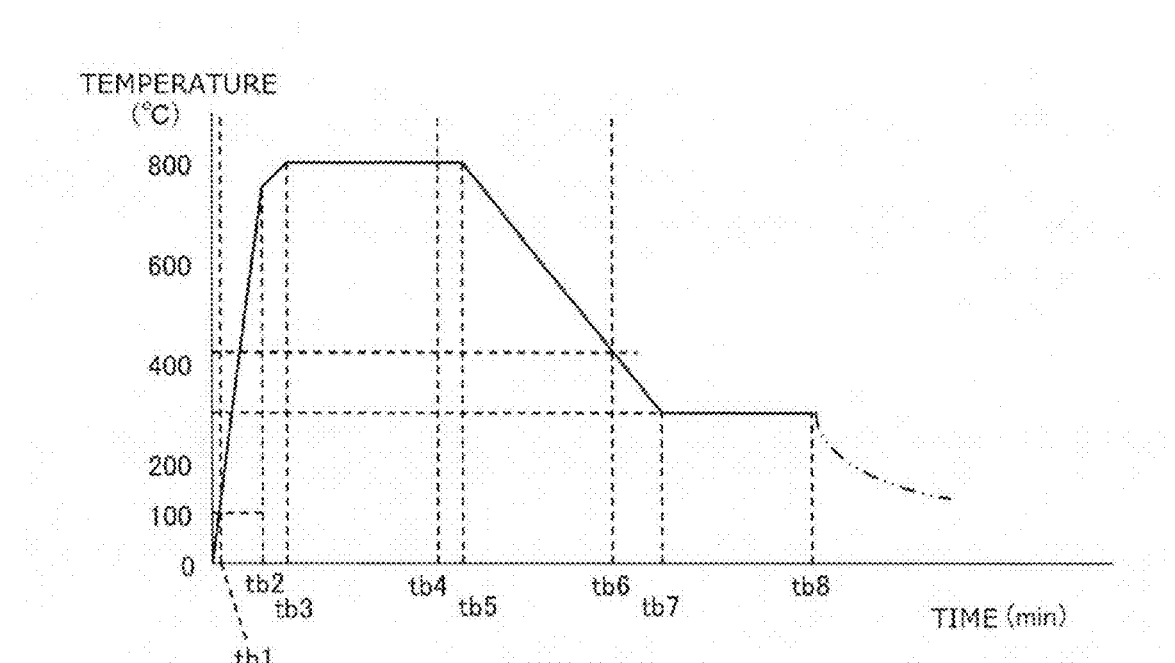
FIG. 7 is a graph illustrating the temperature profile during sintering in the method for manufacturing the oxide superconductor according to the first embodiment, where the vertical axis represents temperature, and the horizontal axis represents time.

FIG. 7 is a graph illustrating the temperature profile during sintering in the method for manufacturing an oxide superconductor according to the first embodiment. The vertical axis represents temperature, and the horizontal axis represents time.

First, as shown in step S21 of FIG. 4, a coating solution is prepared. The coating solution is prepared by e.g. the aforementioned method shown in FIG. 3.

Next, as shown in step S22 of FIG. 4 and FIG. 5, a base material 11 is immersed in and exposed to the coating solution 23, and then pulled up. Thus, a gel film 24 is formed on the base material 11.

Next, as shown in step S23 of FIG. 4, primary heat treatment, i.e., calcination is performed.

In calcination, for instance, as shown in FIG. 6, the temperature is first increased from 0° C. to 100° C. during the time from 0 min to ta1 min, e.g., in 7 minutes, in a dry oxygen atmosphere. Then, the atmosphere is replaced with humidified oxygen, and the temperature is increased to 200° C. during the time from ta1 to ta2, e.g., in 35 minutes. Then, the temperature is increased to 250° C. during the time from ta2 to ta3, e.g., in 250-1000 minutes. Then, the temperature is increased to 300° C. during the time from ta3 to ta4, e.g., in 100 minutes. Then, the temperature is increased to 400° C. during the time from ta4 to ta5, e.g., in 20 minutes. Then, the atmosphere is replaced with dry oxygen, and furnace cooling is performed.

Thus, as shown in step S24 of FIG. 4, a calcined film is formed on the base material 11.

Next, as shown in step S25 of FIG. 4, secondary heat treatment, i.e., sintering is performed.

In sintering, for instance, as shown in FIG. 7, a dry oxygen atmosphere is first used from 0 min to tb1 min. Then, the atmosphere is replaced with a humidified mixed gas of argon Ar and oxygen, and the temperature is increased to 750° C. during the time from tb1 to tb2. Then, the temperature is increased to a temperature in the range of 750-825° C. during the time from tb2 to tb3. Then, the temperature is maintained at a temperature in the range of 750-825° C. during the time from tb3 to tb4. Then, the atmosphere is replaced with a dry mixed gas of argon and oxygen, and the temperature is maintained during the time from tb4 to tb5. Then, the temperature is cooled to a temperature in the range of 375-525° C. during the time from tb5 to tb6. Then, the atmosphere is replaced with a dry oxygen atmosphere, and the temperature is cooled to a temperature in the range of 325-450° C. during the time from tb6 to tb7. Then, the temperature is maintained at 325-450° C. during the time from tb7 to tb8. Then, furnace cooling is performed.

Thus, as shown in step S26 of FIG. 4 and FIG. 1, the oxide superconductor 1 is manufactured. In the case of such a manufacturing method, the oriented superconductor layer 15 contains fluorine residue at $2.0 \times 10^{16}$-$5.0 \times 10^{19}$ atoms/cc and residual carbon at $1.0 \times 10^{18}$-$5.0 \times 10^{20}$ atoms/cc.

Next, the effect of this embodiment is described.

The oxide superconductor 1 according to this embodiment includes an oriented superconductor layer having high orientation. Furthermore, the oriented superconductor layer can be formed on a metal tape. Furthermore, the area of the portion of the lower surface of the oriented superconductor layer in contact with the orientation seeds 13 can be set to 0.3, and preferably 0.1 or less, of the area of the region directly below the oriented superconductor layer. Thus, the oriented superconductor layer can be formed directly on a solid having no lattice matching, such as a metal. By such a structure, a quench current can be passed in the foundation metal when the superconductor layer is quenched.

In the method for manufacturing the oxide superconductor 1 of this embodiment, the oxide superconductor 1 can be manufactured in a normal pressure atmosphere. This can reduce the production cost.

In the foregoing, the diffusion preventing layer 12 is an oxide layer of a prescribed material. However, the embodiment is not limited thereto. For instance, the diffusion preventing layer 12 may be a metal layer containing platinum (Pt), or may be made of fluoride including calcium fluoride ($CaF_2$).

In the foregoing, the orientation seeds 13 are oriented on the diffusion preventing layer 12 using the orientation seed sheet 16. However, the embodiment is not limited thereto. For instance, the orientation seeds 13 may be oriented directly on the diffusion preventing layer 12.

In the foregoing, the oriented superconductor layer 15 contains $DyBa_2Cu_3O_{7-x}$. However, the embodiment is not limited thereto.

For instance, the oriented superconductor layer 15 may contain $LnBa_2Cu_3O_{7-x}$. Here, Ln represents yttrium (Y) or a lanthanoid except cerium (Ce), praseodymium (Pr), promethium (Pm), and lutetium (Lu). In the case of manufacturing the oriented superconductor layer 15 containing the above material, for instance, the metal acetate is at least one material selected from the group consisting of $Y(OCOCH_3)_3$, $Gd(OCOCH_3)_3$, $Tm(OCOCH_3)_3$, and $Er(OCOCH_3)_3$.

Second Embodiment

Next, a second embodiment is described.

Figure 8:
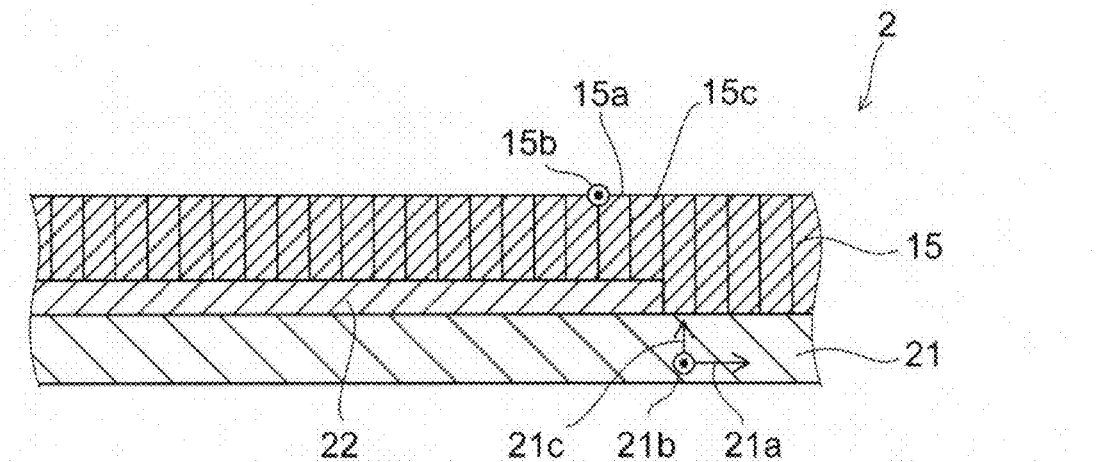
FIG. 8 is a sectional view illustrating an oxide superconductor according to a second embodiment.

FIG. 8 is a sectional view illustrating an oxide superconductor according to the second embodiment.

As shown in FIG. 8, the oxide superconductor according to this embodiment includes a base material (oxide layer, second oxide layer) 21, a metal layer 22, and an oriented superconductor layer 15.

The base material 21 is e.g. a substrate including a monocrystal of lanthanum aluminate ($LaAlO_3$). The upper surface of the base material 21 includes e.g. a (100) surface. The upper surface of the base material 21 includes an oriented portion. The crystal axes of the oriented portion in the upper surface of the base material 21 include e.g. the a-axis 21a and b-axis 21b. The a-axis 21a and the b-axis 21b are directed in two orthogonal directions in the plane parallel to the upper surface of the base material 21. The c-axis 21c is directed in the direction orthogonal to the upper surface of the base material 21. With regard to the orientation degree, $\Delta\phi$ is 10 degrees or less, and preferably 2 degrees or less. For a monocrystalline substrate, $\Delta\phi$ is 0.5 degrees or less.

The metal layer 22 is selectively placed on the base material 21. Thus, the upper surface of the base material 21 includes a portion covered with the metal layer 22 and a portion not covered with the metal layer 22. The metal layer 22 contains e.g. a noble metal such as platinum (Pt).

The oriented superconductor layer 15 is placed on the base material 21 and on the metal layer 22. The base material 21 and the metal layer 22 are provided in contact with the lower surface of the oriented superconductor layer 15. The oriented superconductor layer 15 includes a monocrystalline portion. The monocrystalline portion includes crystal axes of the a-axis 15a, b-axis 15b, and c-axis 15c. In the monocrystalline portion, the crystal axes are oriented. With regard to the orientation direction of the crystal axes in the monocrystalline portion of the oriented superconductor layer 15, $\Delta\phi$ is 10 degrees or less, and preferably 2 degrees or less.

The a-axis 15a and the b-axis 15b are directed in e.g. two orthogonal directions in the plane parallel to the upper surface of the base material 21. For instance, the a-axis 15a is oriented along the a-axis 21a of the base material 21. The b-axis 15b is oriented along the b-axis 21b of the base material 21. The a-axis and the b-axis are nearly equal in length, and thus are interchanged depending on the position in this structure. The c-axis 15c is directed in the direction of the c-axis 21c of the base material 21. The portion of 90% or more of the oriented superconductor layer 15 includes oriented crystals. The crystal axes of the base material 21 function as an orientation seed for orienting the oriented superconductor layer 15 formed on the base material 21. On the other hand, the function as an orientation seed served by the metal layer 22 is nearly zero compared with the crystal axes of the base material 21.

The oriented superconductor layer 15 contains e.g. $DyBa_2Cu_3O_{7-x}$ superconductor material.

The oriented superconductor layer 15 contains fluorine residue at $2.0 \times 10^{16}$-$5.0 \times 10^{19}$ atoms/cc and residual carbon at $1.0 \times 10^{18}$-$5.0 \times 10^{20}$ atoms/cc.

The area of the region directly below the portion of the oriented superconductor layer 15 oriented with a swing angle of 10 degrees or less is denoted by SS. The area of the portion of the lower surface of the oriented superconductor layer 15 in contact with the base material 21 oriented with a swing angle of 10 degrees or less is denoted by SO. The relationship between the area SS and the area SO is area SO<0.3×area SS, i.e., the area SO is 0.3 times or less the area SS. Preferably, the area SO is 0.1 times or less the area SS. The thickness of the portion of the oriented superconductor layer 15 other than directly above the portion in contact with the base material 21 is 1 micrometer (µm) or more. On the metal layer 22, the width of the oriented superconductor layer 15 in the direction parallel to the upper surface of the metal layer 22 is 1 micrometer (µm) or more, and preferably 5 micrometers (µm) or more.

Next, a method for manufacturing the oxide superconductor 2 according to this embodiment is described.

Figure 9:
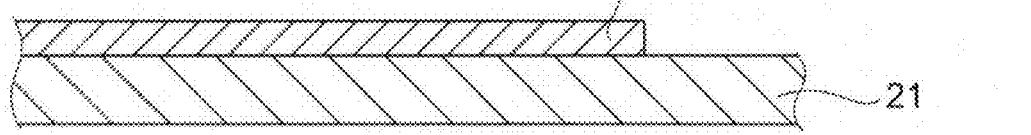
FIG. 9 is a process sectional view illustrating a method for manufacturing the oxide superconductor according to the second embodiment.

FIG. 9 is a process sectional view illustrating the method for manufacturing an oxide superconductor according to the second embodiment.

First, as shown in FIG. 9, a base material 21 is prepared. The base material 21 is e.g. a substrate including a monocrystal of lanthanum aluminate ($LaAlO_3$). The upper surface of the base material 21 includes e.g. a (100) surface. The upper surface of the base material 21 includes an oriented portion. In the oriented portion in the upper surface of the base material 21, $\Delta\phi$ is 10 degrees or less, and preferably 2 degrees or less.

Next, for instance, by the sputtering method, a metal such as platinum (Pt) is deposited on the base material 21 to form a metal layer 22 on the base material 21. For instance, by the photolithography method, the metal layer 22 is patterned so that the base material 21 is partly covered with the metal layer 22. The base material 21 and the metal layer 22 are referred to as foundation. The foundation includes the oriented portion of the base material 21, and the metal layer 22.

Next, the flow shown in FIG. 3 is performed to form a coating solution.

Next, the base material 21 is coated with the coating solution. Then, by the spin coating method, a gel film is formed on the base material 21. In the spin coating method, the acceleration time is set to 0.4 seconds, the rotational speed is set to 4000 rpm, and the holding time is set to 150 seconds.

Next, primary heat treatment, i.e., calcination is performed.

Calcination is performed by e.g. the heat treatment process shown in FIG. 6. Here, the time from ta2 to ta3 in FIG. 6 is set to 11 hours and 43 minutes. The heat treatment is performed in 4.2% humidified pure oxygen atmosphere.

Thus, a calcined film is formed on the base material 21.

Next, secondary heat treatment, i.e., sintering is performed.

Sintering is performed by e.g. the heat treatment process shown in FIG. 7. Here, during the time from tb3 to tb4 in FIG. 7, the temperature is maintained at 800° C. in 4.2% humidified argon atmosphere mixed with 1000 ppm of oxygen. During the time from tb5 to tb6, the temperature is decreased to 525° C. Then, the atmosphere is replaced with a dry oxygen atmosphere, and the temperature is decreased to 450° C. during the time from tb6 to tb7. Then, the temperature is maintained at 450° C. during the time from tb7 to tb8.

Thus, as shown in FIG. 8, the oxide superconductor 2 is manufactured. In the case of such a manufacturing method, the oriented superconductor layer 15 contains fluorine residue at $2.0\times10^{16}$-$5.0\times10^{19}$ atoms/cc and residual carbon at $1.0\times10^{18}$-$5.0\times10^{20}$ atoms/cc.

Next, the effect of the second embodiment is described.

The base material 21 used in this embodiment includes a monocrystal. This can improve the orientation of the oxide superconductor.

In general, an oxide or crystal having high orientation is difficult to form on a metal layer. However, according to this embodiment, the oxide superconductor can be expanded to above the metal layer using the upper surface of the base material 21 as orientation seeds. Thus, a crystal having high orientation can be formed on the metal layer. The configuration and effect of this embodiment other than the foregoing are similar to those of the above first embodiment.

Next, examples are described.

Example 1

Powder of hydrates of metal acetates, e.g., $Dy(OCOCH_3)_3$, $Ba(OCOCH_3)_2$, and $Cu(OCOCH_3)_2$, was each dissolved in ion-exchanged water. Each solution was mixed and stirred with a reaction equimolar amount of trifluoroacetate ($CF_3COOH$). Then, they were mixed at a metal ion mole ratio of 1:2:3 to obtain a mixed solution. The obtained mixed solution was poured into a recovery flask and subjected to reaction and purification for 12 hours under reduced pressure in a rotary evaporator. Thus, a translucent blue gel or sol was obtained. Part of this gel or sol was dissolved in methanol to obtain a coating solution X of 1.52 M in terms of metal ions. This is a coating solution not highly purified.

The obtained gel or sol was completely dissolved in methanol equivalent to approximately 100 times by weight. Again, the solution was subjected to reaction and purification for 12 hours under reduced pressure in a rotary evaporator. Thus, a translucent blue gel or sol was obtained.

The obtained gel or sol was dissolved in methanol and diluted using a measuring flask. Thus, a coating solution A of 1.52 M in terms of metal ions was obtained.

Substrates 1S1 and 1S2 were prepared. Substrate 1S1 was prepared by forming a Pt film by sputtering completely on top of a $LaAlO_3$ (100) monocrystalline substrate measuring 10 mm square. Substrate 1S2 was prepared by covering half the monocrystalline substrate with Pt. Using the coating solution A, by the spin coating method, film formation was performed on each substrate under the condition of an acceleration time of 0.4 seconds, a rotational speed of 4000 rpm, and a holding time of 150 seconds. Under the condition shown in FIG. 6, the heat treatment time from 200° C. to 250° C. was set to 11 hours and 43 minutes. Heat treatment was performed in 4.2% humidified pure oxygen atmosphere. Thus, calcined film 1Fm1c and calcined film 1Fm2c were obtained from substrate 1S1 and substrate 1S2, respectively. Likewise, from the solution X not highly purified, film formation was performed on substrate 1S2 to obtain calcined film 1Fm3c.

Next, under the condition shown in FIG. 7, sintering was performed at 800° C. in 4.2% humidified argon atmosphere mixed with 1000 ppm of oxygen. Dry pure oxygen was introduced at 525° C. or less. Pure oxygen annealing was performed by maintaining the temperature at 450° C. to obtain $DyBa_2Cu_3O_{7-x}$. The sample names are sample 1Fm1f, sample 1Fm2f, and sample 1Fm3f, respectively.

Phase identification was performed on sample 1Fm1f, sample 1Fm2f, and sample 1Fm3f by the thin film X-ray diffraction method. Then, a good $DyBa_2Cu_3O_{7-x}$ (00n) peak was observed. The peak of sample 1Fm1f was considerably weaker than that of sample 1Fm2f. However, the peak was sufficient to measure the pole figure using the (103) surface. Thus, pole figure measurement was performed on sample 1Fm1f. Here, with regard to sample 1Fm2f, it is known that the XRD spot impinges thereon with a diameter of approximately 6 mm during pole figure measurement. It is unclear whether the Pt film formation surface of sample 1Fm2f only 10 mm square is measured, or $DyBa_2Cu_3O_{7-x}$ on the non-Pt film formation surface is measured.

Figure 10A:
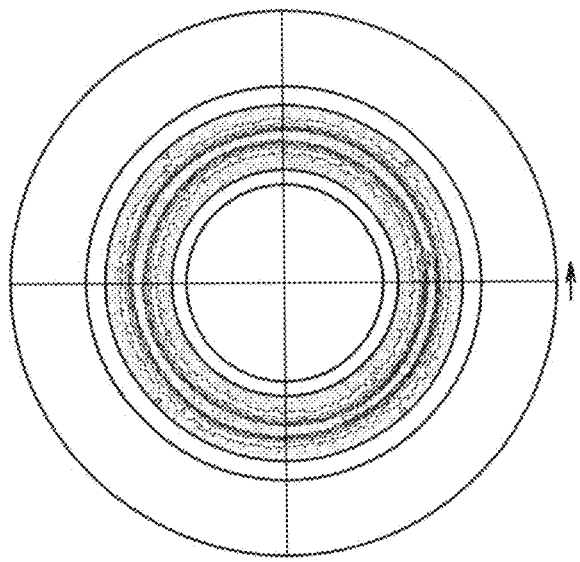
FIG. 10A is a pole figure of an oriented superconductor layer measured by a thin film X-ray diffraction method.
Figure 10B:
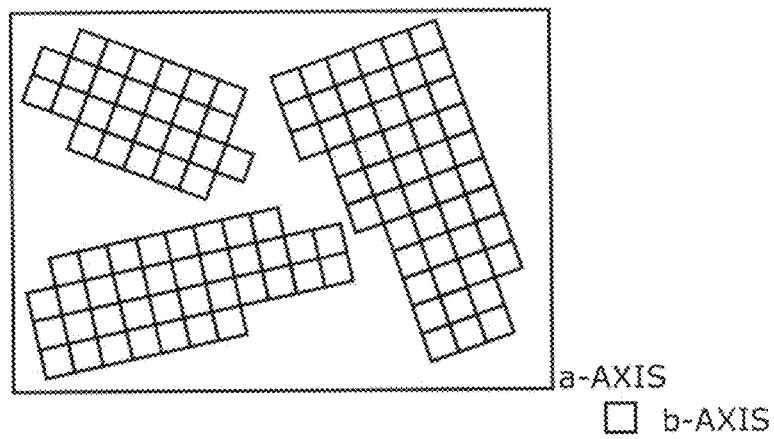
FIG. 10B is a schematic plan view illustrating a crystal structure of the oriented superconductor layer.
Figure 10C:
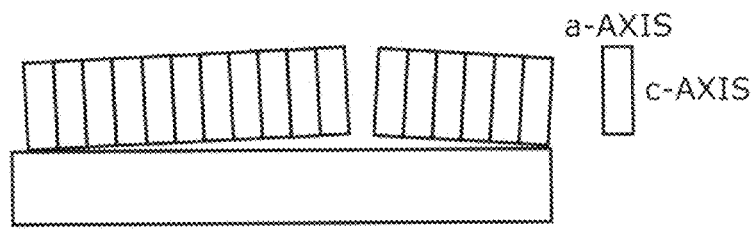
FIG. 10C is a schematic sectional view illustrating the crystal structure of the oriented superconductor layer.

FIG. 10A is a pole figure of the oriented superconductor layer measured by the thin film X-ray diffraction method. FIG. 10B is a schematic plan view illustrating the crystal structure of the oriented superconductor layer. FIG. 10C is a schematic sectional view illustrating the crystal structure of the oriented superconductor layer.

As shown in FIG. 10A, peaks occur at positions of 44-46 degrees from the vertex. The peak intensity appears nearly annular. This indicates a uniaxially oriented texture with the c-axis directed in the perpendicular direction but the in-plane orientation being random.

It is said that in $LnBa_2Cu_3O_{7-x}$ superconductors (Ln is Y or a lanthanoid element), not limited to $DyBa_2Cu_3O_{7-x}$, crystal growth is slow in the c-axis direction, and fast in the a-axis and b-axis direction. The ratio is said to be approximately in the range from 1:100 to 1:1000. As shown in FIG. 10A, in the oriented superconductor layer, only the c-axis orientation is aligned, but the in-plane orientation direction is random.

As shown in FIGS. 10B and 10C, as observed from above, the c-axis oriented texture is aligned on the substrate, but the in-plane orientation is random.

This result suggests that the TFA-MOD method using a high purity solution tends to form a c-axis oriented texture in the case where there is no influence of the substrate in e.g. orientation. In the TFA-MOD method, particles grow in liquid phase. Thus, particles tend to bind in the in-plane direction in which the growth rate is fast. Thus, physically, the c-axis tends to be directed in the direction perpendicular to the substrate. The discovery of the c-axis orientation is probably the world's first experimental fact. FIG. 10A shows that based on this experimental fact, an oriented layer is completed by applying an orientation force along another axis. Here, in the case of not using a high purity solution, this phenomenon has not been confirmed. One conceivable cause is that impurity in the solution remains on the film surface and hampers the lateral crystal growth.

Pt and $LnBa_2Cu_3O_{7-x}$ superconductor are near in lattice constant and lattice matched with each other. For instance, according to JCPDS card 00-004-0802, Pt is shaped like a rectangular solid with an axial length of 3.92 Å. According to JCPDS card 00-040-0211, for $DyBa_2Cu_3O_{7-x}$ superconductor, the a-axis length and the b-axis length are 3.89 Å and 3.82 Å, respectively. Thus, $DyBa_2Cu_3O_{7-x}$ superconductor is lattice matched with Pt, with a mismatch as small as 1% or less. This Pt layer is formed on the $LaAlO_3$ (100) substrate. According to JCPDS card 01-085-0848, $LaAlO_3$ has an axial length of 3.79 Å. Thus, $LaAlO_3$ has good lattice matching with Pt, with a mismatch of 3% or less. Nevertheless, as shown in FIG. 10A, it is not oriented. This is attributable to polarity.

$LaAlO_3$ and $DyBa_2Cu_3O_{7-x}$ are metal oxides, and thus have large polarity, with the metal charged positive and oxygen charged negative. This results from the difference in electronegativity. In film formation at approximately 600° C. or more, substances having large polarity have certain energy, and have a strong tendency to be oriented with each other inheriting the lattice matching. On the other hand, Pt is a metal. Thus, all the Pt atoms located on the surface have no large polarization of charge. That is, Pt has little polarity. Thus, it is considered that while a film of $DyBa_2Cu_3O_{7-x}$ formed directly on $LaAlO_3$ exhibits a clearly oriented texture, the orientation basically fails to be inherited in the case where a Pt layer is interposed.

Figure 11:
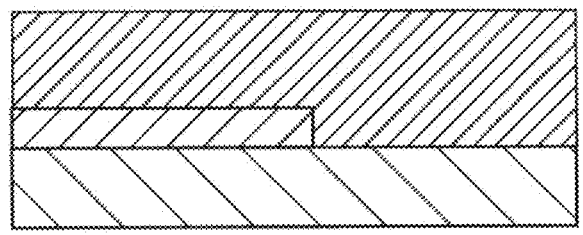
FIG. 11 is a schematic sectional view of an oriented superconductor layer formed on a base material and on a metal layer formed on the base material.
Figure 11:
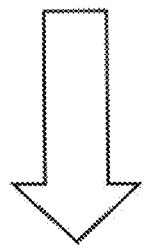
Figure 11:
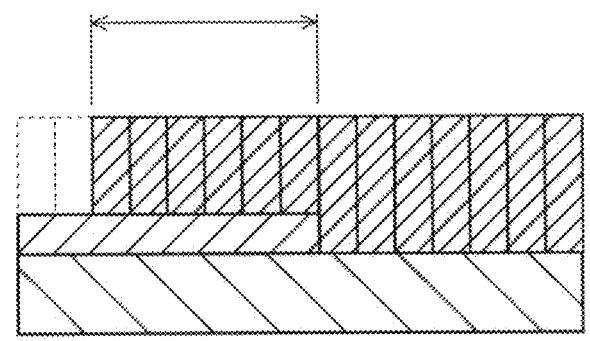

FIG. 11 is a schematic sectional view of an oriented superconductor layer formed on a base material and on a metal layer formed on the base material.

As shown in FIG. 11, in sample 1Fm2f, a film of Pt is formed only halfway, and superconductor film formation is performed thereon. This sample 1Fm2f is intended to measure the propagation distance of the oriented layer, examining the oriented layer propagation distance from the Pt film formation boundary layer. It cannot be characterized by XRD. Thus, characterization was performed by high resolution TEM and diffraction images. Cross-sectional observation was performed at a distance of 5 µm, 10 µm, 20 µm, and 40 µm distanced from the boundary surface to the Pt side. Many observations were performed because it was considered that any influence of oriented layer propagation from an invisible (e.g., back side) position may then be revealed. It is considered that if there is a certain tendency at the above four positions, oriented layer propagation can be confirmed.

Figure 12:
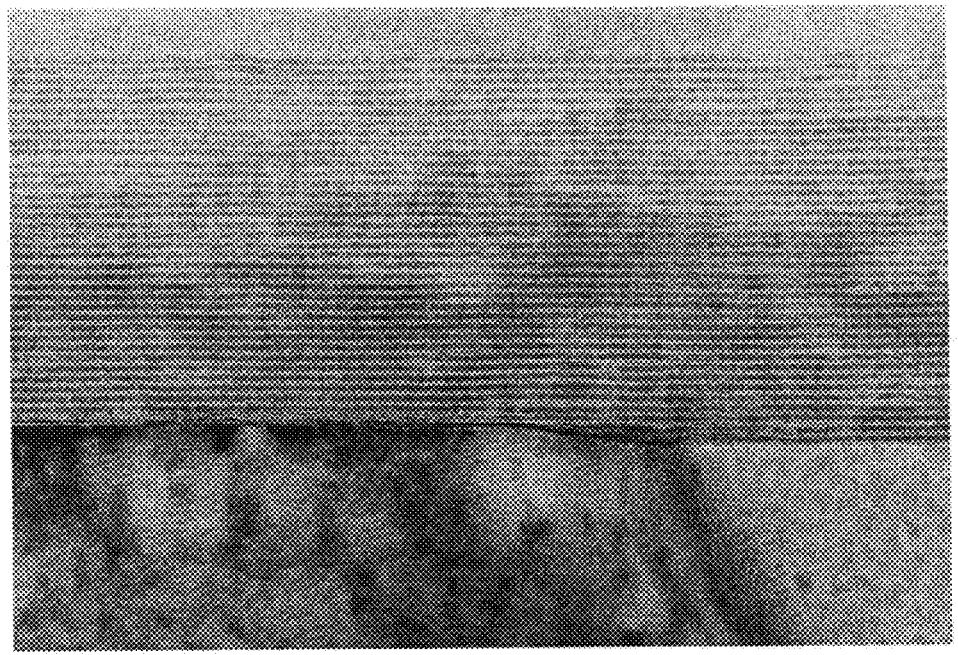
FIG. 12 is a high resolution cross-sectional TEM photograph of the oriented superconductor layer at a position of 5 μm from the Pt film formation boundary surface.

FIG. 12 is a high resolution cross-sectional TEM photograph of the oriented superconductor layer at a position of 5 µm from the Pt film formation boundary surface.

It has been demonstrated from the result of FIG. 10A that a lattice mismatched texture is formed by film formation on a Pt layer. That is, even if a $DyBa_2Cu_3O_{7-x}$ superconductor layer is formed, although it is known that the c-axis is formed upward in the figure, its in-plane direction should be random. As shown in FIG. 12, as observed with reference to the $LaAlO_3$ substrate, the $DyBa_2Cu_3O_{7-x}$ superconductor layer and the $LaAlO_3$ monocrystalline substrate are matched in orientation. That is, this result shows that with the $LaAlO_3$ portion used as orientation seeds, the oriented layer propagates nearly completely to a position of 5 µm.

Furthermore, as shown in FIG. 12, the distance between the metal layer and the oxide oriented layer is 5 nm or less. Thus, an oriented layer in closer contact with the metal than the oriented layer formed by magnetic field is realized. Furthermore, as seen from this figure, a clear atomic image can be observed at positions up to 5 µm. This indicates $\Delta\phi<0.2$ degrees. It is considered that this state extends equally to both sides of the orientation seeds.

Figure 13:
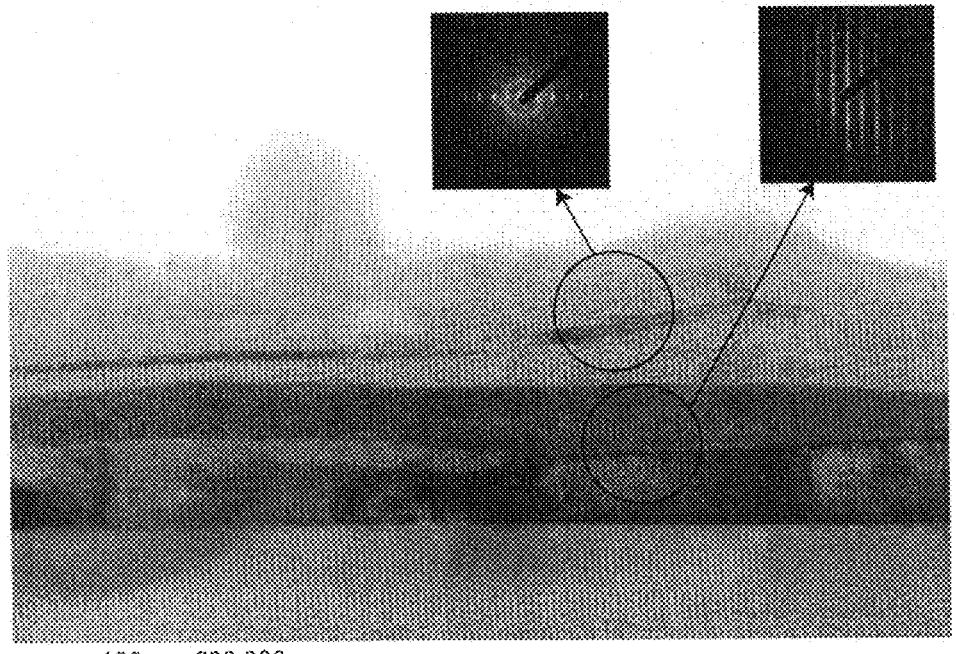
FIG. 13 is a high resolution cross-sectional TEM photograph of the oriented superconductor layer at a position of 10 μm from the Pt film formation boundary surface.

FIG. 13 is a high resolution cross-sectional TEM photograph of the oriented superconductor layer at a position of 10 µm from the Pt film formation boundary surface.

As shown in FIG. 13, in this cross-sectional TEM image, no clear lattice image is visible. The diffraction image shown at upper left indicates the result of propagation of orientation, although weak. At a position of 5 µm, a strong tendency of oriented layer propagation was observed. However, at a position of 10 µm, it was found that the c-axis orientation is weakened to the level such that it can only be confirmed in the diffraction image.

Figure 14:
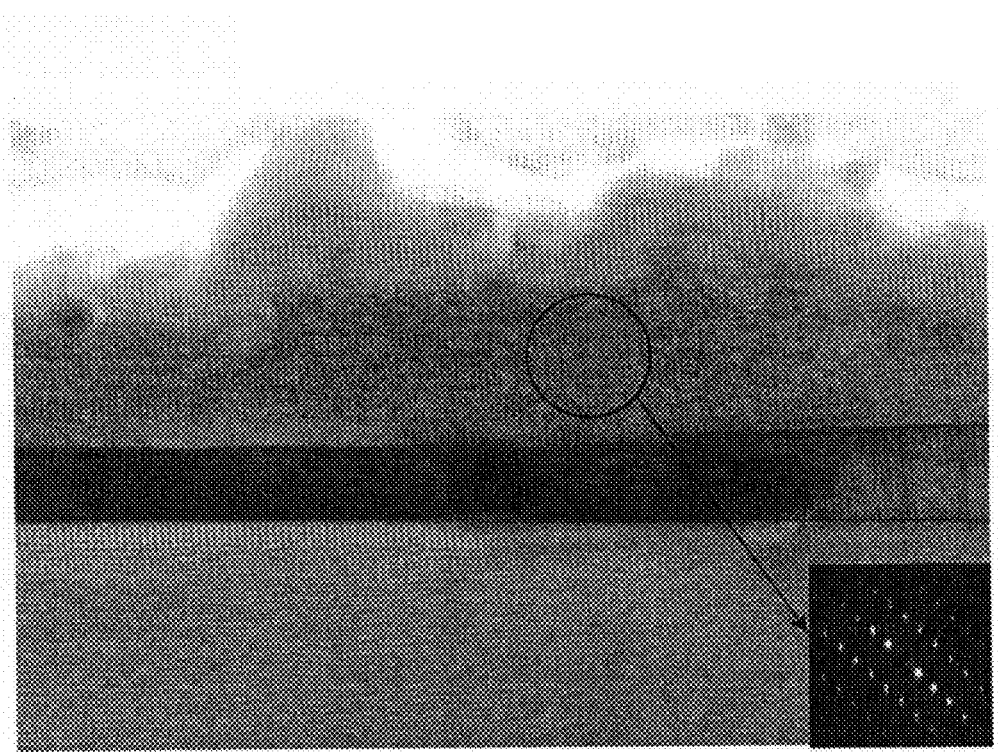
FIG. 14 is a high resolution cross-sectional TEM photograph of the oriented superconductor layer at a position of 20 μm from the Pt film formation boundary surface.

FIG. 14 is a high resolution cross-sectional TEM photograph of the oriented superconductor layer at a position of 20 µm from the Pt film formation boundary surface.

As shown in FIG. 14, in this cross-sectional TEM image, no arrangement of atoms is observed. Furthermore, the diffraction image is further disturbed. Thus, it is found that the orientation is not propagated.

Figure 15:
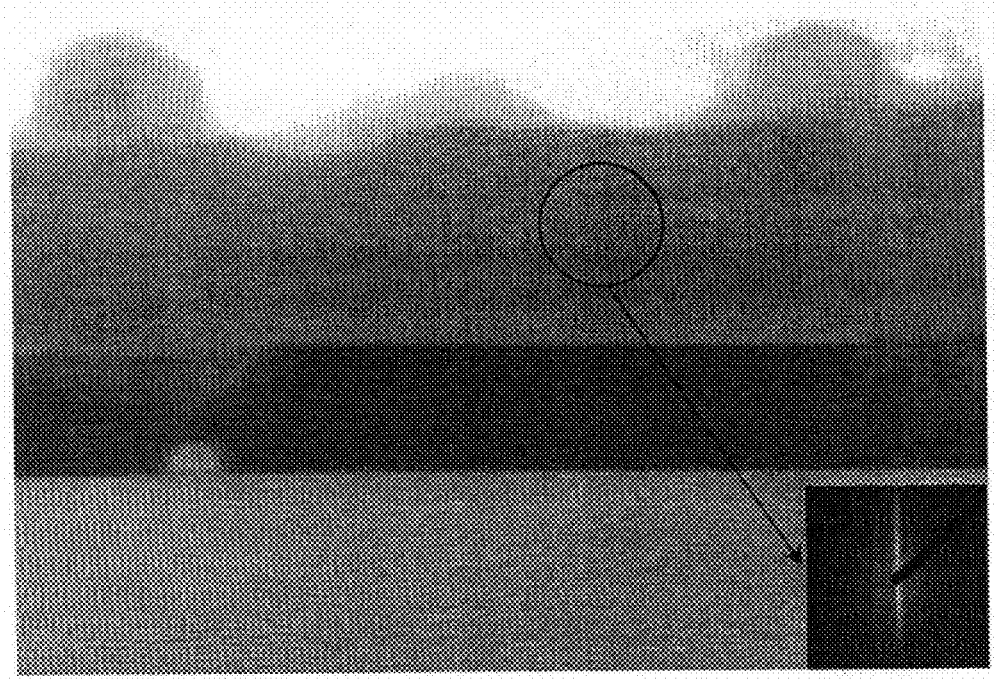
FIG. 15 is a high resolution cross-sectional TEM photograph of the oriented superconductor layer at a position of 40 μm from the Pt film formation boundary surface.

FIG. 15 is a high resolution cross-sectional TEM photograph of the oriented superconductor layer at a position of 40 µm from the Pt film formation boundary surface.

As shown in FIG. 15, the oriented layer is scarcely propagated. It is only observed that a nearly uniaxially oriented texture along the c-axis is formed on Pt.

The above results indicate the following with regard to the oriented layer propagation under this condition. Up to 5 µm, the layer is oriented at the atomic level with $\Delta\phi<0.2$ degrees. At 10 µm, although the biaxial orientation is weak, the influence is confirmed. At 20 µm, the influence is weaker. At 40 µm, the influence is scarcely exerted. It is considered that this oriented layer propagation distance can be increased by decreasing the heat treatment temperature and reducing the amount of humidification. Although high resolution TEM observation is not directly performed, it is supported by the experimental results of XRD measurement data indirectly indicating it. Here, from each TEM observation result, no different phase such as CuO and $Y_2O_3$ is observed inside the film. This results from the film formation using a high purity solution. As indicated by the result of sample 1Fm3f described later, it is considered that oriented layer propagation requires a high purity solution.

The above results indicate that even under this condition, if linear orientation seeds are placed with a spacing of 10 µm or less, the oriented layer is propagated. According to the past results, the TFA-MOD method forms a good superconductor layer even if $\Delta\phi$ for the foundation metal and $CeO_2$ intermediate layer is 8 degrees. This is because, although the characteristics are slightly decreased at low angle grain boundary, the current is passed between the superconductor layers through the low angle grain boundary. However, the loss of superconducting current increases as this low angle grain boundary becomes smaller. According to experiments using bicrystals, it is considered that the attenuation of superconducting current is small if the low angle grain boundary is 4 degrees or less.

In the IBAD (ion beam assisted deposition) method and RABiTS (rolling assisted biaxially textured substrate) method, $\Delta\phi$ of orientation seeds is limited in principle. In the oriented layer formation technology according to this example, the factor determining $\Delta\phi$ corresponds to $\Delta\phi$ of orientation seeds arranged on the substrate. More specifically, ceramic nanofibers serving as orientation seeds are dispersed in a solution with a dispersant, and included in an organic substance to be burned by heating. Thus, the ceramic nanofibers are formed into a narrow wire, and $\Delta\phi$ of the fibers is set to 2 degrees or less (nearly zero). The narrow wires are shaped like a sheet and attached to a substrate. Then, the fibers serving as orientation seeds are arranged with small $\Delta\phi$. By sintering, only the orientation seeds made of oxide are left. Thus, orientation seeds having high orientation are realized by a simple method. The oxide superconductor and the method for manufacturing the same according to the first and second embodiments are one of the technologies for realizing an oriented texture having small orientation degree that cannot be realized in principle by the IBAD method and RABiTS method.

High resolution TEM observation for sample 1Fm3f was performed similarly. In this sample, no oriented layer was observed even at a position of 5 μm from the Pt interface. There is a considerable distance from the Pt interface to the observation position. Thus, it is difficult to identify the phenomenon by high resolution TEM observation with high magnification. However, from the results of XRD measurement, it is considered that a c-axis oriented texture is indeed formed. It is conceived that only the propagation of the oriented layer from orientation seeds has failed. Presumably, different phases (such as CuO and $Y_2O_3$) other than the superconductor layer resulting from impurity in the solution are formed and prevent the propagation of the oriented layer. It is considered that the oriented layer propagation phenomenon requires a high purity solution for the TFA-MOD method and a specific condition for heat treatment.

Example 2

Powder of hydrates of metal acetates, e.g., $Y(OCOCH_3)_3$, $Ba(OCOCH_3)_2$, and $Cu(OCOCH_3)_2$, was each dissolved in ion-exchanged water. Each solution was mixed and stirred with a reaction equimolar amount of $CF_3COOH$. Then, they were mixed at a metal ion mole ratio of 1:2:3 to obtain a mixed solution. The obtained mixed solution was poured into a recovery flask and subjected to reaction and purification for 12 hours under reduced pressure in a rotary evaporator. Thus, a translucent blue gel or sol was obtained.

The obtained gel or sol was completely dissolved in methanol equivalent to approximately 100 times by weight. Again, the solution was subjected to reaction and purification for 12 hours under reduced pressure in a rotary evaporator. Thus, a translucent blue gel or sol was obtained.

The obtained gel or sol was dissolved in methanol and diluted using a measuring flask. Thus, a coating solution B of 1.52 M in terms of metal ions was obtained. The flow chart up to forming a superconductor is as shown in FIG. 4.

Furthermore, instead of $Y(OCOCH_3)_3$ described above, $Gd(OCOCH_3)_3$, $Tm(OCOCH_3)_3$, and $Er(OCOCH_3)_3$ were used to obtain coating solutions C, D, and E of 1.52 M in terms of metal ions.

Substrates 2S1 and 2S2 were prepared, four substrates for each. In substrate 2S1, the top of a $LaAlO_3$ (100) monocrystalline substrate measuring 10 mm square is completely covered with Pt. In substrate 2S2, only half the monocrystalline substrate was covered with Pt. Using the coating solutions B, C, D, and E, by the spin coating method, film formation was performed on each substrate under the condition similar to that of the above Example 1. Under the condition similar to that of the above Example 1 shown in FIG. 6, heat treatment was performed. Thus, on substrates 2S1, calcined film 2Fm1Bc, calcined film 2Fm1Cc, calcined film 2Fm1Dc, and calcined film 2Fm1Ec were obtained. On substrates 2S2, calcined film 2Fm2Bc, calcined film 2Fm2Cc, calcined film 2Fm2Dc, and calcined film 2Fm2Ec were obtained.

Next, under the condition similar to that of the above Example 1 shown in FIG. 7, heat treatment was performed to obtain $LnBa_2Cu_3O_{7-x}$. The sample names are sample 2Fm1Bf, sample 2Fm1Cf, sample 2Fm1Df, and sample 2Fm1Ef on substrates 2S1, and sample 2Fm2Bf, sample 2Fm2Cf, sample 2Fm2Df, and sample 2Fm2Ef on substrates 2S2, respectively.

Phase identification was performed on all the films by the thin film X-ray diffraction method. Then, a good $LnBa_2Cu_3O_{7-x}$ (00n) peak was observed. The $LnBa_2Cu_3O_{7-x}$ (00n) peak of sample 2Fm1Bf, sample 2Fm1Cf, sample 2Fm1Df, and sample 2Fm1Ef was relatively weak. However, the peak was sufficient to measure the pole figure using the (103) surface. By pole figure measurement, as in Example 1, it was found that a uniaxially oriented texture (oriented along the c-axis only) is obtained.

In sample 2Fm2Bf, sample 2Fm2Cf, sample 2Fm2Df, and sample 2Fm2Ef, a film of Pt is formed only halfway, and superconductor film formation is performed thereon. These samples are intended to measure the propagation distance of the oriented layer. As in Example 1, characterization was performed by high resolution TEM and diffraction images. Cross-sectional observation was performed at a distance of 5 μm and 10 μm distanced from the boundary surface to the Pt side. As a result, a good biaxially oriented texture was observed at a distance of 5 μm. In this experiment, even if the elemental species of Ln was changed, no particular difference was observed.

Example 3

On top of a $LaAlO_3$ (100) monocrystalline substrate measuring 10 mm square, the peripheral portion was chipped off so as to form a $LaAlO_3$ protrusion having a width of 5 μm and a length of 100 μm. Pt film formation was performed including this portion. Furthermore, the portion was polished and cleaned. Thus, substrate 3S1 was prepared. Substrate 3S1 has a structure in which a $LaAlO_3$ monocrystalline substrate having a width of 5 μm is sandwiched between the Pt portions. In the above substrate preparation, substrate 3S2 with the width being 1 μm was prepared simultaneously.

Using the coating solution A, film formation was performed on each substrate under the condition similar to that of the above Example 1. Heat treatment similar to that of the above Example 1 shown in FIG. 6 was performed. Thus, calcined film 3Fm1c and calcined film 3Fm2c were obtained, respectively.

Next, heat treatment similar to that of the above Example 1 shown in FIG. 7 was performed to obtain $DyBa_2Cu_3O_{7-x}$. The sample names are sample 3Fm1f and sample 3Fm2f, respectively.

Phase identification was performed on all the films by the thin film X-ray diffraction method. Then, a good $DyBa_2Cu_3O_{7-x}$ (00n) peak was observed. It appears that this $DyBa_2Cu_3O_{7-x}$ (00n) peak includes a uniaxially oriented portion and a biaxially oriented portion in a mixed manner. However, the X-ray irradiation region in XRD measurement has a diameter of approximately 6 mm. Thus, separation of these portions is impossible. Cross-sectional TEM observation was performed on each sample.

In sample 3Fm1f, a good biaxially oriented superconductor texture was observed not only directly above the 5 μm width of the $LaAlO_3$ substrate portion, but also at positions of 5 μm on both sides thereof. That is, in the formed texture, the $LaAlO_3$ portion serving as orientation seeds has a width of 5 μm. However, at least in the superconductor layer portion, the oriented layer continues to the position of a width of 15 μm. In the orientation seed layer, the region with a swing angle of 10 degrees or less with respect to the lattice matched direction is referred to as region So. Then, the region So measures 5 μm×length 100 μm. In the superconductor layer, the c-axis oriented region with a swing angle of 10 degrees or less is referred to as region Ss. Then, the region Ss measures 15 μm×length 100 μm. Conventionally, the region Ss serving as orientation seeds has an area nearly equal to that of the region So. To the best of our knowledge, there is no report on the structure satisfying region So/region Ss<0.95. In the structure obtained in this sample, region So/region Ss=0.33. This is the first structure that realizes a structure in which a biaxially oriented superconductor layer is in contact with a Pt layer made of metal.

In sample 3Fm2f, a good biaxially oriented superconductor texture was observed not only directly above the 1 μm width of the $LaAlO_3$ substrate portion, but also at positions of 5 μm on both sides thereof. That is, in the formed texture, the $LaAlO_3$ portion serving as orientation seeds has a width of 1 μm. However, at least in the superconductor layer portion, the oriented layer continues to the position of a width of 11 μm. The region So measures 1 μm×length 100 μm. Likewise, region Ss measures 11 μm×length 100 μm. In this structure, region So/region Ss=0.091, which is small. This is a structure in which a biaxially oriented superconductor layer is in contact with a Pt layer made of metal.

Conventionally, a structure with region So/region Ss<0.95 has been unfeasible. However, this example has realized a structure in which region So/region Ss falls below 0.30 or 0.10. Furthermore, a structure with an oriented layer formed directly on a metal is realized for the first time.

Example 4

A film of Pt was formed entirely on a $LaAlO_3$ (100) monocrystalline substrate measuring 10 mm square. Strips of width 1 μm×thickness 100 nm×length 100 μm are cut out from another $LaAlO_3$ (100) monocrystalline substrate. In a substrate referred to as substrate 4S1, only one strip is placed on Pt. In a substrate referred to as substrate 4S2, three strips are placed at 2 degrees or less with respect to the orientation direction. On Pt of substrate 4S2, the three strips are placed nearly parallel to each other (with a deviation angle of 2 degrees or less) with a spacing of 10 μm.

Using the coating solution A, film formation was performed on each substrate by the spin coating method under the condition similar to that of the above Example 1. Heat treatment similar to that of the above Example 1 shown in FIG. 6 was performed. Thus, calcined films are formed on substrate 4S1 and substrate 4S2, referred to as calcined film 4Fm1c and calcined film 4Fm2c, respectively.

Next, heat treatment similar to that of the above Example 1 shown in FIG. 7 was performed to obtain $DyBa_2Cu_3O_{7-x}$. The sample names are sample 4Fm1f and sample 4Fm2f, respectively.

Phase identification was performed on all the films by the thin film X-ray diffraction method. Then, a good $DyBa_2Cu_3O_{7-x}$ (00n) peak was observed. It appears that this $DyBa_2Cu_3O_{7-x}$ (00n) peak includes a uniaxially oriented portion and a biaxially oriented portion in a mixed manner. However, the X-ray irradiation region in XRD measurement has a diameter of approximately 6 mm. Thus, separation of these portions is impossible. Cross-sectional TEM observation was performed to examine the internal structure.

In sample 4Fm1f, a good biaxially oriented superconductor texture was observed not only directly above the 1 μm width of the $LaAlO_3$ substrate portion, but also at positions of 5 μm on both sides thereof. That is, in the formed texture, the $LaAlO_3$ portion serving as orientation seeds has a width of 1 μm. However, at least in the superconductor layer portion, the oriented layer continues to the position of a width of 11 μm. In the orientation seed layer, the region with a swing angle of 10 degrees or less with respect to the lattice matched direction is referred to as region So. Then, the region So measures 1 μm×length 100 μm. In the superconductor layer, the c-axis oriented region with a swing angle of 10 degrees or less is referred to as region Ss. Then, the region Ss measures 11 μm×length 100 μm. In the structure obtained in this sample, region So/region Ss=0.091.

In sample 4Fm2f, a good biaxially oriented superconductor texture was observed not only directly above the total 3 μm width of the $LaAlO_3$ substrate portion, but also continuously at positions of 33 μm including 5 μm on both sides thereof. That is, in the formed texture, the $LaAlO_3$ portion serving as orientation seeds has a width of 3 μm. However, at least in the superconductor layer portion, the oriented layer continues to the position of a width of 33 μm. In the orientation seed layer, the region with a swing angle of 10 degrees or less with respect to the lattice matched direction is referred to as region So. Then, the region So measures 3 μm×length 100 μm. In the superconductor layer, the c-axis oriented region with a swing angle of 10 degrees or less is referred to as region Ss. Then, the region Ss measures 33 μm×length 100 μm. In the structure obtained in this sample, region So/region Ss=0.091.

In the structure realized in sample 4Fm2f, although on a metal, $\Delta\phi$ of the superconductor layer formed from a plurality of orientation seeds is less than 2 degrees. Because it is a small region, $\Delta\phi$ of this portion cannot be observed using pole figure measurement. However, the oriented layer is propagated from the $LaAlO_3$ strip serving as an orientation seed. Thus, it is considered that good superconducting characteristics are achieved at low angle grain boundary. In principle, the conventional IBAD method and RABiTS method cannot form a structure with such small $\Delta\phi$ on a metal tape. This example has first realized a structure of an oxide layer with small $\Delta\phi$ obtained on a metal.

Example 5

A film of Pt was formed entirely on a $LaAlO_3$ (100) monocrystalline substrate measuring 10 mm square. Strips of width 1 μm×thickness 100 nm×length 100 μm are cut out from another LaAlO$_3$ (100) monocrystalline substrate. In a substrate referred to as 5S1, only one strip is placed on Pt. In a substrate referred to as 5S2, three strips are placed at 2 degrees or less with respect to the orientation direction. On Pt of 5S2, the three strips are placed nearly parallel to each other with a spacing of 10 μm.

Using the coating solution B, film formation was performed on each substrate by the spin coating method similar to that of the above Example 1. Heat treatment similar to that of the above Example 1 shown in FIG. 6 was performed. Thus, calcined films are formed on substrates 5S1 and 5S2, referred to as calcined film 5Fm1c and calcined film 5Fm2c, respectively.

Next, heat treatment similar to that of the above Example 1 shown in FIG. 7 was performed to obtain YBa$_2$Cu$_3$O$_{7-x}$. The sample names are sample 5Fm1f and sample 5Fm2f, respectively.

Phase identification was performed on all the films by the thin film X-ray diffraction method. Then, a good YBa$_2$Cu$_3$O$_{7-x}$ (00n) peak was observed. It appears that this YBa$_2$Cu$_3$O$_{7-x}$ (00n) peak includes a uniaxially oriented portion and a biaxially oriented portion in a mixed manner. However, the X-ray irradiation region in XRD measurement has a diameter of approximately 6 mm. Thus, separation of these portions is impossible. Cross-sectional TEM observation was performed to examine the internal structure.

In sample 5Fm1f, a good biaxially oriented superconductor texture was observed not only directly above the 1 μm width of the LaAlO$_3$ substrate portion, but also at positions of 5 μm on both sides thereof. That is, in the formed texture, the LaAlO$_3$ portion serving as orientation seeds has a width of 1 μm. However, at least in the superconductor layer portion, the oriented layer continues to the position of a width of 11 μm. In the orientation seed layer, the region with a swing angle of 10 degrees or less with respect to the lattice matched direction is referred to as region So. Then, the region So measures 1 μm×length 100 μm. In the superconductor layer, the c-axis oriented region with a swing angle of 10 degrees or less is referred to as region Ss. Then, the region Ss measures 11 μm×length 100 μm. In the structure obtained in this sample, region So/region Ss=0.091.

In sample 5Fm2f, a good biaxially oriented superconductor texture was observed not only directly above the total 3 μm width of the LaAlO$_3$ substrate portion, but also continuously at positions of 33 μm including 5 μm on both sides thereof. That is, in the formed texture, the LaAlO$_3$ portion serving as orientation seeds has a width of 3 μm. However, at least in the superconductor layer portion, the oriented layer continues to the position of a width of 33 μm. In the orientation seed layer, the region with a swing angle of 10 degrees or less with respect to the lattice matched direction is referred to as region So. Then, the region So measures 3 μm×length 100 μm. In the superconductor layer, the c-axis oriented region with a swing angle of 10 degrees or less is referred to as region Ss. Then, the region Ss measures 33 μm×length 100 μm. In the structure obtained in this sample, region So/region Ss=0.091.

In the structure realized in sample 5Fm2f, although on a metal, Δφ of the superconductor layer formed from a plurality of orientation seeds is less than 2 degrees. Because it is a small region, Δφ of this portion cannot be observed using pole figure measurement. However, the oriented layer is propagated from the LaAlO$_3$ strip serving as an orientation seed. Thus, it is considered that good superconducting characteristics are achieved at low angle grain boundary. In principle, the conventional IBAD method and RABiTS method cannot form a structure with such small Δφ on a metal tape. This structure is first obtained by highly arranging orientation seeds.

Example 6

A film of Pt was formed entirely on a LaAlO$_3$ (100) monocrystalline substrate measuring 10 mm square. Strips of width 1 μm×thickness 100 nm×length 100 μm are cut out from a CeO$_2$ (100) film formed to a thickness of 150 nm on another substrate. In a substrate referred to as substrate 6S1, three strips are placed at 2 degrees or less with respect to the orientation direction. On Pt of substrate 6S1, the three strips are placed nearly parallel to each other with a spacing of 6 μm.

Using the coating solution A, film formation was performed on the substrate by the spin coating method similar to that of the above Example 1. Heat treatment similar to that of Example 1 shown in FIG. 6 was performed. Thus, a calcined film is formed on substrate 6S1, referred to as calcined film 6Fm1c.

Next, heat treatment similar to that of the above Example 1 shown in FIG. 7 was performed to obtain DyBa$_2$Cu$_3$O$_{7-x}$. The sample name is sample 6Fm1f.

Phase identification was performed on all the films by the thin film X-ray diffraction method. Then, a good DyBa$_2$Cu$_3$O$_{7-x}$ (00n) peak was observed. It appears that this DyBa$_2$Cu$_3$O$_{7-x}$ (00n) peak includes a uniaxially oriented portion and a biaxially oriented portion in a mixed manner. However, the X-ray irradiation region in XRD measurement has a diameter of approximately 6 mm. Thus, separation of these portions is impossible. Cross-sectional TEM observation was performed to examine the internal structure. It is considered that this oriented film has a structure inclined 45 degrees in the in-plane direction. This is because the lattice constant of CeO$_2$ is equal to that of the superconductor multiplied by approximately the square root of 2 (i.e., 1.41), and thus the structure inclined 45 degrees in the horizontal in-plane direction is lattice matched.

In sample 6Fm1f, a good biaxially oriented superconductor texture was observed not only directly above the 3 μm width of the CeO$_2$ portion, but also in the region between the three positions and at positions of 3 μm on both sides thereof. That is, in the formed texture, the CeO$_2$ portion serving as orientation seeds has a width of 3 μm. However, at least in the superconductor layer portion, the oriented layer continues to the position of a width of 21 μm. In the orientation seed layer, the region with a swing angle of 10 degrees or less with respect to the lattice matched direction is referred to as region So. Then, the region So measures 3 μm×length 100 μm. In the superconductor layer, the c-axis oriented region with a swing angle of 10 degrees or less is referred to as region Ss. Then, the region Ss measures 21 μm×length 100 μm. In the structure obtained in this sample, region So/region Ss=0.145.

As described above, in principle, a highly oriented texture with Δφ<2 has been conventionally unfeasible by the IBAD method and RABiTS method. However, using the above examples, such a texture can be formed on a metal tape. Furthermore, the ratio of the orientation seeds to the oriented layer, i.e., region So/region Ss, is conventionally nearly 1. In contrast, the above examples can realize a structure with the ratio falling below 0.3 or 0.1. In view of polarity, forming an oxide oriented layer directly on a metal is a difficult technology. However, according to the above examples, even this structure can be realized by propagating an oriented texture from an oriented layer placed separately. Advantageously, a quench current flows in the foundation metal when the superconductor layer is quenched. Also in view of an oxide having this structure, this is probably the structure realized for the first time in these examples.

Using this technology, a diffusion preventing layer can be formed by MOD, and a tape with orientation seeds arranged in a sheet can be attached thereto and sintered. This method is entirely a non-vacuum process along with the TFA-MOD method. Furthermore, a texture with small $\Delta\phi$ is formed. Thus, a superconductor wire material with good characteristics can be expected. The diffusion preventing layer may be made of not only oxide, but also fluoride such as $CaF_2$. With regard to fibers serving as orientation seeds, a narrow wire including them can be made and spread into a tape. Thus, the orientation seeds can be arranged with small $\Delta\phi$ like a sheet. The sheet is attached and then strongly sintered to burn away the material other than the oxide. Thus, only the orientation seeds with small $\Delta\phi$ can be formed. Accordingly, this embodiment is part of a technology in which an oxide texture with small $\Delta\phi$ conventionally unattainable by the IBAD method and RABiTS method is formed into a metal tape.

Comparative Example

Next, a comparative example is described.

In oxide superconductors, the superconductor layer has a perovskite structure containing yttrium or lanthanoids. However, the orientation seeds are derived from not the superconductor layer but the foundation layer. In the superconductor circuit formation technology for film formation on a monocrystal, the superconductor layer is oriented using the orientation degree of the monocrystal. However, in applications for wire materials and coils, a superconductor film is formed on a metal tape. Thus, orientation seeds are needed somewhere.

With regard to the oriented layer formation technology, there are two major technologies as follows. One is the oriented oxide layer formation technology based on the IBAD (ion beam assisted deposition) method. The other is the technology such as the RABiTS (rolling assisted biaxially textured substrate) method in which a metal layer is oriented by the rolling technique and an oxide layer is oriented thereon. Besides, oriented layer formation based on liquid phase formation and magnetic force has also been proposed. However, there have been no results comparable to the oriented layer formation technology based on the IBAD method and RABiTS method. Oriented layer formation is primarily based on the above IBAD method and RABiTS method. The two oriented layer formation technologies are described below.

The IBAD method is a technology in which an oxide is deposited on an unoriented metal irradiated with argon ions, and the orientation degree is gradually improved. As the unoriented metal, Hastelloy-C is often used. As an ion source, argon ions are often used. The metal oxide to be oriented was YSZ in the early phase of the emergence of the IBAD method. Subsequently, it was $Ga_2Zr_2O_7$. In these years, it is often MgO. In this technology, the oxide oriented layer is formed at approximately 70° C., i.e., nearly normal temperature. Oxide particles are scattered in a vacuum while being irradiated with argon ion beams. Thus, the orientation degree of the deposited oxide layer is gradually improved. The principle of orientation has not been completely elucidated.

The most problematic in this technology is that improvement in orientation degree is gradual, and the orientation degree is supposed to have a limit value. In a deposition layer formed on an unoriented foundation metal tape (Hastelloy-C) by the IBAD method, $\Delta\phi$ of the initial film formation layer having a film thickness of approximately 10 nm is approximately 20 degrees, which is very large. Furthermore, presumably because the substrate temperature during film formation is as low as approximately 70° C., improvement of $\Delta\phi$ is very gradual. Even when the film formation layer based on the IBAD method reaches approximately 1 μm, $\Delta\phi$ is often approximately 10 degrees.

In order to improve this drawback of the IBAD method, a technology has been developed to improve $\Delta\phi$ in a deposition layer in which the oriented layer is relatively thin. In this approach, an unoriented layer is formed directly below the IBAD layer. The IBAD method fails to improve the oriented layer without ion beam assistance. Thus, at least this ion beam irradiation is involved in the improvement of orientation degree.

Ion beam assisted oxide particles impinge on the base material. If ordered large polarity exists on the base material, the improvement of orientation in the IBAD method performing low temperature film formation is more gradual than in the case where the directly underlying layer is amorphous. This is presumably because, on the amorphous layer having small polarity, oxide particles assisted by argon ions can move more freely. However, the details are unclear.

It appears that orientation is more likely to be improved if this amorphous layer is not a monolayer but a bilayer. In superconductor wire materials commercially available at present, on two foundation amorphous layers, an orientation seed layer is formed by the IBAD method, and two oriented oxide layers are formed thereon. In fact, on top of a stacked structure of five layers, a superconductor layer is formed.

It is necessary to consider to what extent the orientation degree is improved in principle by this IBAD method. The principle of the IBAD method is not completely elucidated. However, obviously, argon ions assist the deposited oxide in some way to improve the orientation. If the irradiation with argon ions is not unidirectional, it is considered that the arrangement of the oriented layer is probably disordered. Thus, it is considered that at least the parallelity of this argon ion irradiation is involved in the improvement of orientation.

With regard to this argon ion irradiation, it is known that in the case where a YSZ layer is oriented, the best orientation is obtained by irradiation at obliquely 55 degrees. The parallelity of argon ions and $\Delta\phi$ of the oxide layer forming an oriented layer under the influence thereof are not in one-to-one correspondence. Argon ions can affect the deposited oxide only instantaneously at least at the time of impingement. In view of this, it is anticipated that the orientation degree is improved only by ½ or ⅓ of the parallelity of argon ions. With regard to the parallelity of argon ions, irradiation is performed after ionization. Thus, electrically repulsing particles impinge while spreading to some extent. Furthermore, the ion irradiation source cannot be distanced infinitely from the film formation sample. Moreover, the irradiation source itself has a certain size. Thus, argon ions flying therefrom cannot realize parallel ion irradiation. It is considered that it has an angle of approximately 5 degrees in terms of $\Delta\phi$. It is considered that an oriented layer with large $\Delta\phi$ is formed. However, by optimization, the factor can be made close to 1. From these considerations, it is anticipated that $\Delta\phi$ obtained for an infinitely large film thickness by the IBAD method is 5 degrees or more.

For superconductor wire materials in which the superconducting characteristics are improved by improving $\Delta\phi$, most reports show that $\Delta\phi$ of the intermediate layer formed by the IBAD method is approximately 6 degrees. Of course, for a short length, a small sample with small $\Delta\phi$ may be obtained. However, basically, it is considered that $\Delta\phi$ of the oriented film formed by the IBAD method is approximately 5 degrees at the minimum.

Next, the RABiTS method is described. In this technology, a metal such as Ni—W is plastically deformed by rolling. Thus, atoms are oriented in the rolling direction. An oxide layer is formed thereon so that the orientation is propagated thereto. Furthermore, approximately two oxide layers are stacked to form an orientation template of superconductor. Plastic deformation of a metal cannot be repeated infinitely. The orientation degree is only improved to the extent that the tape is not broken. In oriented textures reported at present, $\Delta\phi$ is 6-8 degrees. This is $\Delta\phi$ of the rolled metal. However, also in the three metal oxide layers stacked thereon, this $\Delta\phi$ is not deteriorated. Rather, depending on the condition, presumably because the upper metal oxide layers have self-orientation property, it is often the case that $\Delta\phi$ has a value improved by approximately 0.2-0.3 degrees.

The first oxide layer formed directly on the metal by the RABiTS method needs to inherit the orientation from the basically nonpolar metal oriented layer to the oxide layer. Thus, the film formation condition is narrowed. It is found that out of the film formation condition, the orientation degree is extremely deteriorated. The first layer is also referred to as SEED layer and often made of e.g. $Y_2O_3$ or $CeO_2$. The second layer is a layer for preventing diffusion from the foundation metal. It is referred to as diffusion preventing layer (barrier layer), and often made of e.g. YSZ. The first layer and the second layer are both polar. Thus, it is considered easy to perform film formation while maintaining the orientation degree. Likewise, the third layer needs to prevent chemical reaction of e.g. HF in the reaction of the TFA-MOD method. The third layer is also referred to as cap layer.

These three oriented layers are all formed at approximately 700° C. The formed oxide particles have sufficient energy. Thus, the orientation degree tends to be slightly improved. This is what is called the self-orientation property. This self-orientation property may be exhibited also by the superconductor layer, because the superconductor layer itself is an oxide layer. It is known that this self-orientation property results in improvement of approximately 0.3 degrees even for a total of four layers including the superconductor layer. That is, when $\Delta\phi$ of the rolled metal layer is 6 degrees, the superconductor layer is improved to approximately $\Delta\phi=5.6$ degrees under good film formation condition. However, in this RABiTS method, the oriented layer with $\Delta\phi$ being 6 degrees or less is difficult to realize.

The embodiments described above can provide an oxide superconductor, an oriented oxide thin film, and a method for manufacturing an oxide superconductor capable of improving the orientation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An oxide superconductor comprising:
   an oriented superconductor layer containing fluorine at $2.0\times10^{16}$-$5.0\times10^{19}$ atoms/cc and carbon at $1.0\times10^{18}$-$5.0\times10^{20}$ atoms/cc, containing in 90% or more a portion oriented along c-axis with an in-plane orientation degree ($\Delta\phi$) of 10 degrees or less, and containing a $LnBa_2Cu_3O_{7-x}$ superconductor material (wherein Ln being yttrium (Y) or a lanthanoid except cerium (Ce), praseodymium (Pr), promethium (Pm), and lutetium (Lu); and
   an oxide layer provided in contact with a lower surface of the oriented superconductor layer and oriented with an in-plane orientation degree ($\Delta\phi$) of 10 degrees or less with respect to one crystal axis of the oriented superconductor layer,
   area of a portion of the lower surface of the oriented superconductor layer in contact with the oxide layer being 0.3 or less of area of a region directly below the oriented superconductor layer.

2. The superconductor according to claim 1, wherein the oxide layer includes a monocrystal of lanthanum aluminate ($LaAlO_3$).

3. The superconductor according to claim 1, wherein in the lower surface of the oriented superconductor layer, a metal layer is in contact with a portion other than the portion in contact with the oxide layer.

4. The superconductor according to claim 3, wherein the metal layer contains platinum.

5. The superconductor according to claim 1, wherein the oxide layer includes a ceramic fiber.

6. The superconductor according to claim 1, wherein thickness of a portion of the oriented superconductor layer other than directly above the portion in contact with the oxide layer is 1 micrometer or more.

7. The superconductor according to claim 5, wherein aspect ratio of width to thickness of the fiber is 1:5-1:30.

8. The superconductor according to claim 5, wherein the fiber is placed on a diffusion preventing layer provided on a base material.

9. The superconductor according to claim 5, wherein the fiber is oriented with an in-plane orientation degree ($\Delta\phi$) of 2 degrees or less.

10. The superconductor according to claim 1, wherein the oriented superconductor layer contains $DyBa_2Cu_3O_{7-x}$.

11. The superconductor according to claim 1, wherein an unoriented layer in contact with a portion of the lower surface of the oriented superconductor layer other than the portion in contact with the oxide layer contains a material identical to a material contained in the oriented superconductor layer.

12. The superconductor according to claim 8, wherein the diffusion preventing layer contains fluoride.

13. An oriented oxide thin film comprising:
   a first oxide layer containing fluorine at $2.0\times10^{16}$-$5.0\times10^{19}$ atoms/cc and carbon at $1.0\times10^{18}$-$5.0\times10^{20}$ atoms/cc and containing in 90% or more a portion oriented with an in-plane orientation degree ($\Delta\phi$) of 10 degrees or less; and
   a second oxide layer provided in contact with a lower surface of the first oxide layer and oriented with an in-plane orientation degree ($\Delta\phi$) of 10 degrees or less with respect to one crystal axis of the first oxide layer,
   area of a portion of the lower surface of the first oxide layer in contact with the second oxide layer being 0.3 or less of area of a region directly below the first oxide layer.

14. A method for manufacturing an oxide superconductor, comprising:
   forming a gel film by forming an oriented portion in a foundation and exposing the oriented portion and a portion other than the oriented portion to a solution containing metal trifluoroacetate, the gel film being formed on the foundation and containing metal and fluoride contained in the metal trifluoroacetate; and
   forming an oriented superconductor layer by heat treating the foundation, the oriented superconductor layer having one crystal axis oriented with the oriented portion on the oriented portion and on the portion other than the oriented portion.

15. The method according to claim 14, wherein the oriented portion is made of a monocrystal of lanthanum aluminate ($LaAlO_3$).

16. The method according to claim 14, wherein the oriented portion is made of a ceramic fiber.

17. The method according to claim 14, wherein the portion other than the oriented portion is a diffusion preventing layer containing oxide.

18. The method according to claim 14, wherein in the forming a gel film, the oriented portion is formed on the foundation by placing an orientation seed sheet including a binder containing an organic component and a plurality of orientation seeds on the foundation and then removing the binder.

19. The method according to claim 18, wherein the orientation seed sheet is formed by including the orientation seeds in the binder to form a narrow wire.

20. The method according to claim 14, wherein the portion other than the oriented portion is a metal layer.

* * * * *